US011069549B2

(12) United States Patent
Wada

(10) Patent No.: US 11,069,549 B2
(45) Date of Patent: Jul. 20, 2021

(54) OVERHEAD TRANSPORT VEHICLE, OVERHEAD TRANSPORT SYSTEM, AND CONTROL METHOD FOR OVERHEAD TRANSPORT VEHICLE

(71) Applicant: Murata Machinery, Ltd., Kyoto (JP)

(72) Inventor: Eiji Wada, Inuyama (JP)

(73) Assignee: Murata Machinery, Ltd., Kyoto (JP)

( * ) Notice: Subject to any disclaimer, the term of this patent is extended or adjusted under 35 U.S.C. 154(b) by 0 days.

(21) Appl. No.: 16/637,441

(22) PCT Filed: Jul. 6, 2018

(86) PCT No.: PCT/JP2018/025688
§ 371 (c)(1),
(2) Date: Feb. 7, 2020

(87) PCT Pub. No.: WO2019/035286
PCT Pub. Date: Feb. 21, 2019

(65) Prior Publication Data
US 2020/0251366 A1 Aug. 6, 2020

(30) Foreign Application Priority Data
Aug. 16, 2017 (JP) .............................. JP2017-157189

(51) Int. Cl.
H01L 21/677 (2006.01)
B65G 1/04 (2006.01)
(Continued)

(52) U.S. Cl.
CPC ...... H01L 21/67718 (2013.01); B65G 1/0457 (2013.01); B65G 47/244 (2013.01);
(Continued)

(58) Field of Classification Search
CPC ......... H01L 21/67718; H01L 21/67724; H01L 21/6773; H01L 21/67733; H01L 21/67736;
(Continued)

(56) References Cited

U.S. PATENT DOCUMENTS 7,796,049 B2 * 9/2010 Ito ........................ B65G 1/1371
340/673
2006/0237525 A1 10/2006 Sone
(Continued)

FOREIGN PATENT DOCUMENTS

JP 2001-171970 A 6/2001
JP 2007-191235 A 8/2007
(Continued)

OTHER PUBLICATIONS

The Extended European Search Report dated Mar. 16, 2021, of counterpart European Application No. 18846912.6.

Primary Examiner — Glenn F Myers
(74) Attorney, Agent, or Firm — DLA Piper LLP (US)

(57) ABSTRACT

An overhead transport vehicle includes: a traveler; a main body; a transferer including a holder, a mover, and a rotator, and which receives or delivers an article from or to a transfer destination; and a controller. The main body has an inner wall at a position at which the article held by the holder comes in contact therewith when the holder set at a storing position is rotated by a predetermined angle by the rotator. The controller causes the traveler to travel while the holder is at the storing position, and when the article is received or delivered, causes the rotator to rotate the holder by a predetermined angle or more about a rotation axis in a state where the holder is set at an exiting position by the mover to align the article with a prescribed orientation of the transfer destination.

2 Claims, 17 Drawing Sheets

(51) Int. Cl.
*B65G 47/244* (2006.01)
*B65G 47/61* (2006.01)

(52) U.S. Cl.
CPC .......... *B65G 47/61* (2013.01); *H01L 21/6773* (2013.01); *H01L 21/67724* (2013.01); *H01L 21/67733* (2013.01); *B65G 2203/0233* (2013.01)

(58) Field of Classification Search
CPC ...... B65G 1/0457; B65G 1/04; B65G 47/244; B65G 47/61; B65G 2201/0297; B65G 2203/0233
See application file for complete search history.

(56) References Cited

U.S. PATENT DOCUMENTS

| | | |
|---|---|---|
| 2007/0163461 A1 | 7/2007 | Shiwaku |
| 2008/0092769 A1 | 4/2008 | Izumi et al. |
| 2009/0276082 A1 | 11/2009 | Murata |
| 2011/0024377 A1 | 2/2011 | Yamamoto |
| 2013/0197691 A1* | 8/2013 | Tsubaki ................. H01L 21/67 700/228 |
| 2013/0216336 A1* | 8/2013 | Lee .................. H01L 21/67733 414/225.01 |
| 2013/0264301 A1* | 10/2013 | Kim ....................... B66C 19/00 212/71 |
| 2015/0203333 A1 | 7/2015 | Ota |
| 2015/0329334 A1* | 11/2015 | Lee ..................... B25J 11/0095 414/222.13 |
| 2016/0297613 A1 | 10/2016 | Nishikawa |
| 2017/0183154 A1 | 6/2017 | Kinugawa et al. |

FOREIGN PATENT DOCUMENTS

| | | |
|---|---|---|
| JP | 2008-100835 A | 5/2008 |
| JP | 4264840 B2 | 5/2009 |
| JP | 2010-165710 A | 7/2010 |
| JP | 4702693 B2 | 6/2011 |
| JP | 2016-199348 A | 12/2016 |
| JP | 2018-049943 A | 3/2018 |
| WO | 2006/104115 A1 | 10/2006 |
| WO | 2014/017222 A1 | 1/2014 |
| WO | 2017/029873 A1 | 2/2017 |

\* cited by examiner (A)

(B)

(A)

(B)

(A)

(B)

(A)

(B)

(A)

(B)

(A)

(B)

(A)

(B)

(A)

(B)

(A)

(B)

OVERHEAD TRANSPORT VEHICLE, OVERHEAD TRANSPORT SYSTEM, AND CONTROL METHOD FOR OVERHEAD TRANSPORT VEHICLE

TECHNICAL FIELD

This disclosure relates to an overhead transport vehicle, an overhead transport system, and a control method for an overhead transport vehicle.

BACKGROUND

In manufacturing factories such as semiconductor manufacturing factories, there has been proposed a transport system that uses an overhead transport vehicle which travels along a track installed on a ceiling to transport articles such as FOUPs for accommodating semiconductor wafers and reticle pods for accommodating reticles, between a load port of a processing tool and a transfer destination such as a storage and a receiving/delivering port. The overhead transport vehicle includes a traveler which travels on a track and a main body mounted on the traveler to move integrally with the traveler (for example, see Japanese Unexamined Patent Application, First Publication No. 2001-171970). JP '970 discloses a configuration in which such an overhead transport vehicle includes inner walls that, when the main body stores an article, sandwich the article from the front side and the rear side thereof in the traveling direction, and the overhead transport vehicle also includes an article holder that holds the article, a lift driver that raises or lowers the article holder, a lateral extender that projects the lift driver to the lateral side of the traveling direction with respect to the main body, and a rotator that rotates the lift driver.

When transporting a FOUP or the like, an overhead transport vehicle stores a FOUP or the like in a main body while an opening/closing lid thereof is oriented laterally with respect to the traveling direction. In this state, the opening/closing lid may not always face the processing tool or the like even when the FOUP or the like is placed on a load port. For this reason, to make the opening/closing lid of the FOUP face the processing tool or the like, it may be sometimes necessary to rotate the FOUP or the like about the vertical axis before placing it. The overhead transport vehicle disclosed in JP '970 has a rotator that rotates an article and employs a configuration in which the article is rotated in a state where the rotation axis of the rotator is offset from the center line of the track. This overhead transport vehicle enables the article held by the holder to rotate about the vertical rotation axis while the holder is stored within the main body and reduces the turning space for the article within the main body, thereby preventing interference of the article with the inner wall of the main body when the article turns. However, since the article is rotated while the article is stored in the main body, a space needs to be provided in the main body to allow the article to rotate therein. As a result, there is a problem that the outer dimension of the main body increases, which leads to an increase in the size of the overhead transport vehicle.

It could therefore be helpful to provide an overhead transport vehicle, a transport system, and a control method for an overhead transport vehicle capable of rotating an article by a predetermined angle or more to be adapted to a transfer destination while reducing the space inside the main body that stores the article and miniaturizing the main body as well as the overhead transport vehicle.

SUMMARY

We thus provide:

An overhead transport vehicle comprising: a traveler to travel on a track provided on a ceiling or in the vicinity of the ceiling; a main body mounted on the traveler; a transferer which includes a holder to hold an article, a mover to move the holder between a storing position at which the article held by the holder is stored within the main body and an exiting position at which the article exits the main body, and a rotator to rotate the holder about a vertical rotation axis, the transferer receiving or delivering the article from or to a transfer destination where the article is to be placed in a prescribed orientation; and a controller to control operations of the traveler and the transferer, wherein the main body has an inner wall at a position at which the article held by the holder comes in contact therewith when the holder set at the storing position is rotated by a predetermined angle by the rotator, and the controller causes the traveler to travel in a state where the holder is set at the storing position by the mover, and when the article is received from or delivered to the transfer destination by the transferer, causes the rotator to rotate the holder by the predetermined angle or more in a state where the holder is set at the exiting position by the mover to align the article held by the holder with the prescribed orientation of the transfer destination.

The mover may include a lift driver which raises or lowers the holder between the storing position and the exiting position at which the article held by the holder exits downward from the main body. The rotator may freely be raised or lowered, and the holder may be provided in the rotator.

The mover may include a lateral extender which advances or retracts the holder laterally with respect to the track between the storing position and the exiting position at which the article held by the holder exits laterally from the main body. Dimensions of the lateral extender and the holder as measured in a traveling direction may be smaller than a dimension of the article stored within the main body as measured in the traveling direction.

Our transport system includes a track provided on a ceiling or in the vicinity of the ceiling, and the overhead transport vehicle including a lift driver serving as a mover, wherein the overhead transport vehicle includes a lateral extender which advances or retracts the holder laterally with respect to the track; the track has a straight section and a curved section connected to the straight section; the transfer destination is provided on a lower and lateral side of the curved section; and when the article is received from or delivered to the transfer destination by the transferer, the controller performs control to cause the traveler to stop in the curved section of the track, cause the lift driver to lower the holder to the exiting position, cause the rotator to rotate the holder to align the article held by the holder with the prescribed orientation of the transfer destination, cause the lateral extender to advance the lift driver to a position at which the holder or the article is directly above the transfer destination, and cause the lift driver to lower the holder. The straight section is provided along a side wall of a building; the curved section is provided to curve from the direction of the straight section and be away from the side wall; the transfer destination is provided on a lower and lateral side of the curved section and in the vicinity of the side wall; and the side wall is provided at a position at which the article held by the holder comes in contact therewith when the lateral extender advances the lift driver to a position at which the article is directly above the transfer destination without the rotator rotating the holder after the overhead transport vehicle stops the traveler in the curved section.

Our control method for an overhead transport vehicle includes: a traveler to travel on a track provided on a ceiling or in the vicinity of the ceiling; a main body mounted on the traveler; and a transferer which has a holder to hold an article, a mover which moves the holder between a storing position at which the article held by the holder is stored within the main body and an exiting position at which the article exits the main body, and a rotator to rotate the holder about a vertical rotation axis, receiving or delivering the article from or to a transfer destination where the article is to be placed in a prescribed orientation, the main body having an inner wall at a position at which the article held by the holder comes in contact therewith when the holder set at the storing position is rotated by a predetermined angle by the rotator, the control method comprising: causing the traveler to travel in a state where the holder is set at the storing position by the mover; and causing, when the article is received from or delivered to the transfer destination by the transferer, the rotator to rotate the holder by the predetermined angle or more in a state where the holder is set at the exiting position by the mover to align the article held by the holder with the prescribed orientation of the transfer destination.

The transfer destination may be provided on a lower side of the curved section of the track or on a lower and lateral side of the curved section.

According to the overhead transport vehicle and the control method for an overhead transport vehicle, the clearance between the article and the inner wall is so narrow that the article comes into contact with the inner wall of the holder if the article stored in the main body is rotated by the predetermined angle, and it is therefore possible to reduce the space for storing the article formed by the inner wall in the main body. As a result, it is possible to miniaturize the main body and the overhead transport vehicle. When receiving or delivering the article from or to the transfer destination by the transferer, rotation of the predetermined angle or more is allowed when the article is at the exiting position, and it is therefore possible to prevent the article from contacting the inner wall of the main body. Since the holder can be rotated by the predetermined angle or more, even when the angle of the transfer destination differs from that of the stopped overhead transport vehicle, it is possible to easily and appropriately receive or deliver the article from or to the transfer destination by rotating the holder or the article in alignment with the orientation prescribed at the transfer destination.

When the mover is a lift driver which raises or lowers holder between the storing position and the exiting position at which the article held by the holder exits downward from the main body, it is possible to reliably prevent the article from coming into contact with the inner wall of the main body when rotating the article by rotating the article when the lift driver has lowered the article to the position at which the article exits downward from the main body. Even when an obstacle is present on the lateral side and in the vicinity of the overhead transport vehicle, the article can still be rotated below the main body. When the rotator can freely be raised or lowered by the lift driver and the holder is provided in the rotator, the rotated part can be made smaller compared to performing rotation with inclusion of the entire lift driver, and it is therefore possible to miniaturize the rotator.

When the mover is a lateral extender which advances or retracts the holder laterally with respect to the track between the storing position and the exiting position at which the article held by the holder exits laterally from the main body, it is possible to reliably prevent the article from coming into contact with the inner wall of the main body when rotating the article. Even when an obstacle is present below and in the vicinity of the overhead transport vehicle, the article can still be rotated on the lateral side the main body. When the dimensions of the lateral extender and the holder as measured in a traveling direction are smaller than the dimension of the article stored within the main body as measured in the traveling direction, it is possible to prevent the lateral extender or the holder from coming into contact with an obstacle such as a wall when advancing the lateral extender.

When receiving or delivering the article between the overhead transport vehicle and the transfer destination, the traveler is stopped in the curved section of the track, the holder is lowered to the exiting position by the lift driver, the holder is rotated by the rotator while the article held by the holder is aligned with the prescribed orientation of the transfer destination, the lift driver is advanced by the lateral extender to a position at which the holder or the article is directly above the transfer destination, and the holder is lowered by the lift driver. Therefore, when transferring the article to the transfer destination on the lower and lateral side of the curved section of the track, it is possible, without having the article colliding with the obstacle in the vicinity of the transfer destination, to place the article appropriately on the transfer destination while the article is aligned with the prescribed orientation of the transfer destination. Even when the transfer destination is provided on a lower and lateral side of the curved section and in the vicinity of the building, it is possible, without having the article colliding with the side wall, to receive or deliver the article between the overhead transport vehicle and the transfer destination.

In the control method for an overhead transport vehicle mentioned above, when the transfer destination is arranged on the lower side of the curved section of the track or on the lower and lateral side of the curved section, it is possible to receive or deliver the article from or to such a transfer destination by rotating the holder by the predetermined angle or more.

BRIEF DESCRIPTION OF THE DRAWINGS

FIG. 6(A) is a diagram in which the overhead transport vehicle is stopped in a curved section, and FIG. 6(B) is a diagram in which an article is lowered to an exiting position.

FIG. 7(A) is a diagram in which the article has been rotated and FIG. 7(B) is a diagram in which the article has been advanced.

FIG. 10(A) is a diagram in which the overhead transport vehicle is stopped in a curved section, and FIG. 10(B) is a reference diagram in which the overhead transport vehicle is stopped at another position.

FIG. 12(A) is a plan view and FIG. 12(B) is a diagram as viewed from the traveling direction of the overhead transport vehicle.

FIG. 13(A) is a plan view and FIG. 13(B) is a diagram as viewed from the traveling direction of the overhead transport vehicle.

FIG. 14(A) is a plan view and FIG. 14(B) is a diagram as viewed from the traveling direction of the overhead transport vehicle.

FIG. 15(A) is a plan view and FIG. 15(B) is a diagram as viewed from the traveling direction of the overhead transport vehicle.

FIG. 16(A) is a plan view and FIG. 16(B) is a diagram as viewed from the traveling direction of the overhead transport vehicle.

FIG. 17(A) is a plan view and FIG. 17(B) is a diagram as viewed from the traveling direction of the overhead transport vehicle.

DESCRIPTION OF REFERENCE SIGNS

Figure 1:
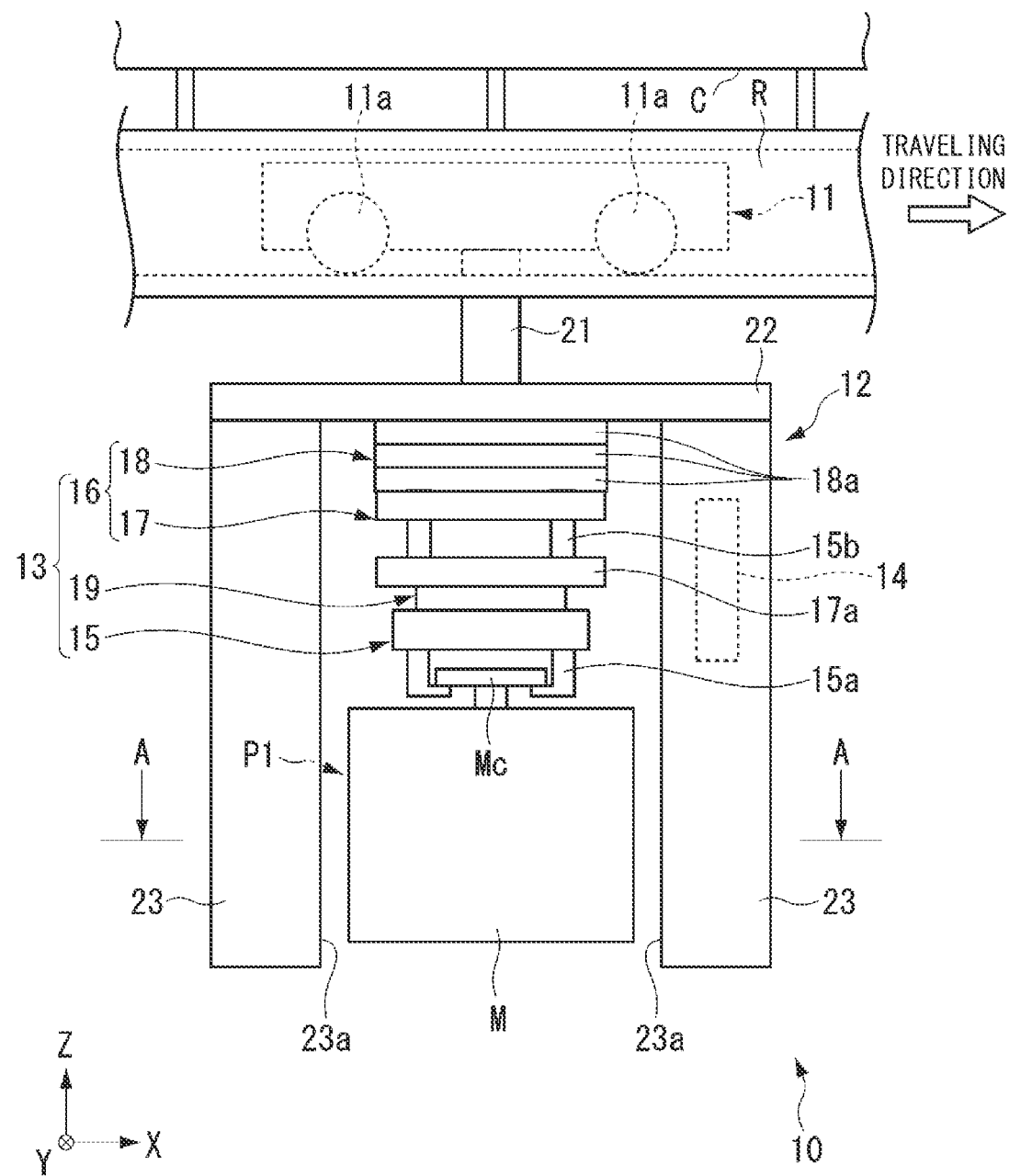
FIG. 1 is a diagram showing an example of an overhead transport vehicle.

C Ceiling
M Article
Ma Lid
P1 Storing position
P2, P3 Exiting position
R Track
R1, R2, R41, R42 Straight section
R3, R43, R44 Curved section
SYS Transport system
10, 10A, 10B, 10C Overhead transport vehicle
11 Traveler
12 Main body
13 Transferer
14 Controller
15 Holder
15b Suspender
16 Mover
17 Lift driver
17a Portion
18 Lateral extender
19 Rotator
20 Cable
20a Holder cable
20b Rotator cable
23 Cover member
23a Inner wall
30, 31, 31A Load port (transfer destination)
32, 32a, 32b Rack
41 Side wall
42 Processing tool

DETAILED DESCRIPTION

The following describes examples with reference to the drawings. However, this disclosure is not limited to the examples. In the drawings, scale is changed as necessary to illustrate the example such as by enlarging or by emphasizing a part. In the following description, an XYZ coordinate system is used to describe the directions in each drawing. In the XYZ coordinate system, a plane that is parallel to a horizontal plane is defined as an XY plane. The X direction represents the traveling direction of an overhead transport vehicle 10 (traveler 11). A direction perpendicular to the XY plane is denoted as a Z direction. For each of the X direction, the Y direction, and the Z direction, description is made with a definition in which a direction indicated by an arrow is the positive (+) direction and a direction opposite to the direction indicated by the arrow is the negative (−) direction.

FIG. 1 is a diagram showing an example of the overhead transport vehicle 10. The overhead transport vehicle 10 shown in FIG. 1 is installed to be able to travel in a semiconductor device manufacturing factory, and transports articles M such as FOUPs accommodating semiconductor wafers used to manufacture semiconductor devices, and reticle pods accommodating processing members such as reticles. In this example, the article M is described as a FOUP, however, the article M need not be a FOUP. The overhead transport vehicle 10 can also be applied to facilities other than those in the semiconductor device manufacturing field and may be used to transport various types of articles.

The article M includes, for example, a lid Ma (see FIG. 2) to take out the content thereof such as a semiconductor wafer. The lid Ma is detachably provided on one of side surfaces of the article M. When the content of the article M is a circular object such as a semiconductor wafer, an inclined part Mb is provided on each of two corner parts on a side opposite to the lid Ma (see FIG. 2). It is possible, with this configuration, to suppress the corner parts of the article M from interfering with other objects when the article M is rotated.

As shown in FIG. 1, the overhead transport vehicle 10 includes a traveler 11, a main body 12, a transferer 13, and a controller 14. The traveler 11 travels in the X direction along a track R installed on or in the vicinity of a ceiling C of a building such as a manufacturing factory. The traveling direction of the traveler 11 (the X direction) is a direction substantially parallel to that of the track R. The traveler 11 includes a traveling driver, not shown in the drawings, and a plurality of wheels 11a, and travels as the wheels 11a roll in the track R. The traveling driver may be, for example, an electric motor provided in the traveler 11 to drive the wheels 11a, or may be a linear motor provided using the track R. Traveling and stopping of the traveler 11 are controlled by the controller 14.

The main body 12 is mounted on the traveler 11 to move integrally with the traveler 11. The main body 12 can store the article M. The main body 12 includes a coupling member 21, a support member 22, and cover members 23. The coupling member 21 is coupled to the traveler 11. The support member 22 is arranged along the horizontal plane and supports the transferer 13. The cover members 23 are arranged to project downward in the vertical direction (the Z direction) from the support member 22. The cover members 23 are arranged respectively on the +X side and the −X side in the traveling direction across a storing position P1 at which the article M is stored. The cover members 23 each have an inner wall 23a on the storing position P1 side to face one another. The two inner walls 23a are both planar and are arranged in parallel with each other.

Figure 2:
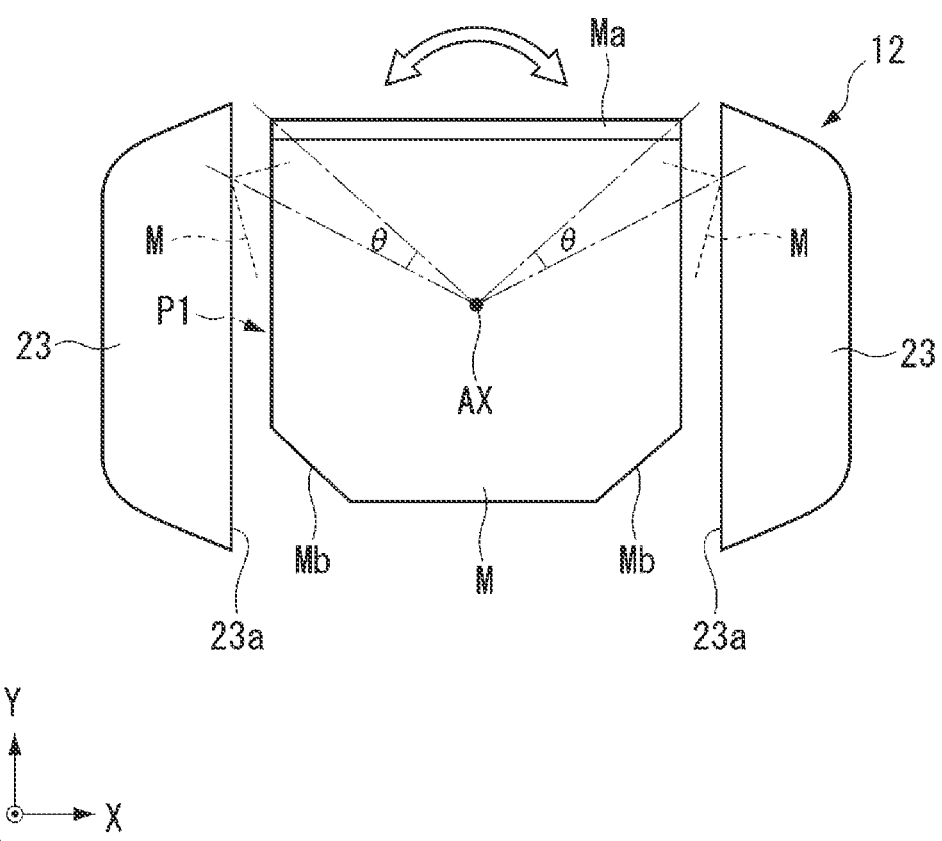
FIG. 2 is a cross-sectional view taken along the line A-A in FIG. 1.

FIG. 2 is a cross-sectional view taken along the line A-A in FIG. 1 and shows a positional relationship between the cover members 23 and the article M in the main body 12. As shown in FIG. 2, the cover members 23 are each arranged at a position where the article M contacts the inner wall 23a when the article M stored at the storing position P1 is rotated by a predetermined angle θ about a rotation axis AX. Therefore, for example, when a rotator 19 rotates a holder 15 (described later) holding the article M by a predetermined angle θ or more, the article M held by the holder 15 also rotates by the predetermined angle θ or more, and a part of the article M comes into contact with the inner walls 23a of the cover members 23. That is to say, in the state where the article M is stored at the storing position P1, the clearance between the article M and the inner wall 23a is so narrow that the article M comes into contact with the inner wall 23a if the holder 15 is rotated.

As shown in FIG. 1, the transferer 13 includes the holder 15 which holds the article M, the rotator 19 which rotates the holder 15 about the vertical (Z direction) rotation axis AX, and a mover 16 which moves the holder 15 and rotator 19 relative to the main body 12.

The holder 15 is provided in the rotator 19. The holder 15 suspends and holds the article M by grasping a flange Mc provided on top of the article M. For example, the holder 15 is a chuck movable in the horizontal direction and having a plurality of claws 15a and suspends and holds the article M by inserting each claw 15a under the flange Mc of the article M and raising the holder 15. The holder 15 is connected to suspenders 15b such as wires and belts. A plurality, for example, two, of suspenders 15b are provided. The operation of the holder 15 is controlled by the controller 14.

The mover 16 includes a lift driver 17 which raises or lowers the holder 15 in the vertical direction (the Z direction), and a lateral extender 18 which advances or retracts (laterally extends) the holder 15 and the lift driver 17 to the lateral side of the track R (in the Y direction, in the lateral direction of the track R, or in the direction orthogonal to the traveling direction). The lift driver 17 is, for example, a hoist, and lowers the holder 15 by feeding out the suspenders 15b and lifts the holder 15 by taking up the suspenders 15b.

The lift driver 17 is controlled by the controller 14 to thereby raise or lower the holder 15 and the rotator 19 at a predetermined speed. The lift driver 17 is also controlled by the controller 14 to thereby maintain the holder 15 at a target height. When the overhead transport vehicle 10 in a stopped state starts traveling by the traveler 11, the overhead transport vehicle 10 starts traveling after, for example, the lift driver 17 has raised the holder 15 to the uppermost position. This operation prevents a part of the overhead transport vehicle 10 from coming into contact with an obstacle below the track R when the overhead transport vehicle 10 travels.

Figure 3:
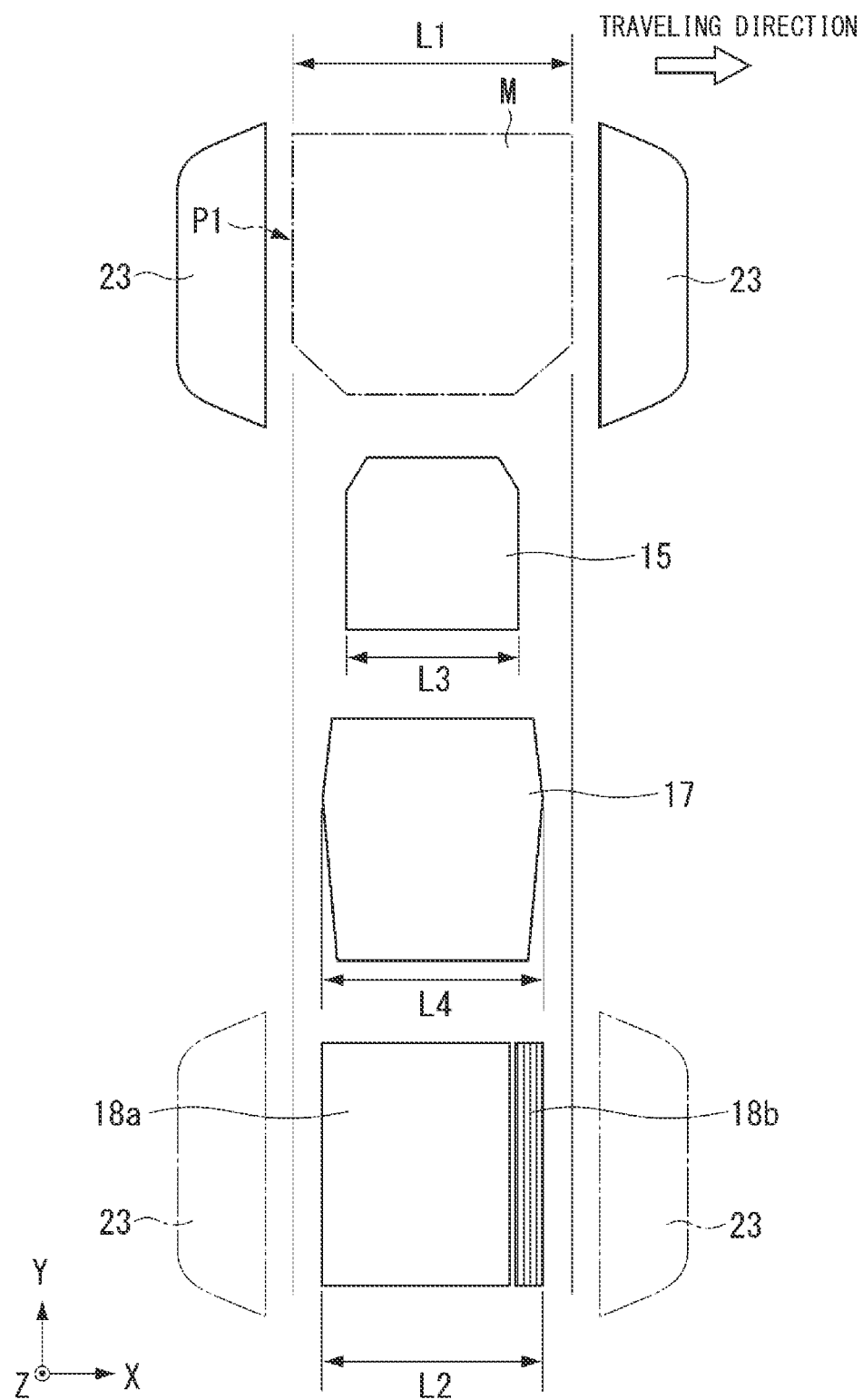
FIG. 3 is a plan view showing an example in which respective constituent elements of the overhead transport vehicle are disassembled laterally (in a lateral direction) with respect to a traveling direction.

The lateral extender 18 has a plurality of movable plates 18a arranged in a vertically overlapped manner, for example, and a cable guide 18b which guides various cables (see FIG. 3). The plurality of movable plates 18a are movable to the lateral side of the traveling direction of the traveler 11 (the Y direction). The lift driver 17 is mounted on the lowermost movable plate 18a. The lateral extender 18 includes a guide not shown in the drawings which guides the movable plates 18a in the Y direction, and a driver not shown in the drawings which moves the movable plates 18a to the lateral side in the traveling direction (the Y direction). The operation of the driver is controlled by the controller 14. The cable guide 18b accommodates various cables and follows the operation of the lateral extender 18. Examples of the various cables guided by the cable guide 18b include control signal cables connected to the holder 15, the lift driver 17, and the rotator 19, and a power supply cable.

FIG. 3 is a diagram showing an example of when respective constituent elements of the overhead transport vehicle 10 are disassembled laterally with respect to the traveling direction (in the Y direction) and viewed from the ceiling side. A dimension L2 of the lateral extender 18, a dimension L3 of the lift driver 17, and a dimension L4 of the holder 15 as measured in the traveling direction are all smaller than the dimension L1 of the article M as measured in the traveling direction. The lateral extender 18 is of a configuration in which the movable plates 18a and the cable guide 18b are arranged side by side in the traveling direction. The dimension L2 of the lateral extender 18 is a combined dimension of the movable plates 18a arranged side by side in the traveling direction and the cable guide 18b.

As shown in FIG. 3, the dimensions L2, L3, L4 of the lateral extender 18, the lift driver 17, and the holder 15 are smaller than the dimension L1 of the article M, and it is therefore possible to avoid the lateral extender 18 from coming into contact with a wall or various apparatuses before the article M does, when the lateral extender 18 advances the holder 15.

Figure 4:
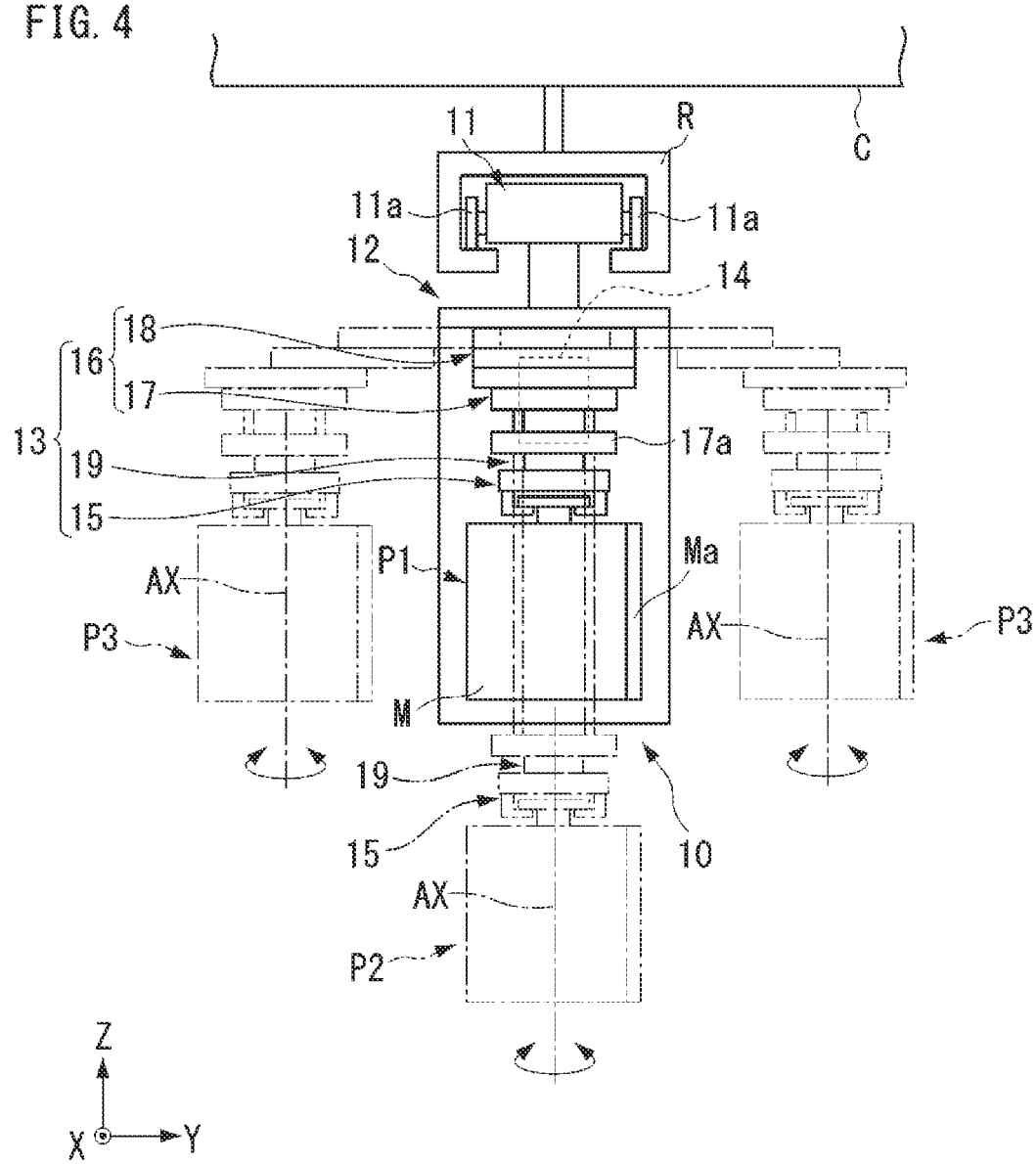
FIG. 4 is a diagram showing an example in which the overhead transport vehicle is viewed in the traveling direction.

FIG. 4 is a diagram showing an example where the overhead transport vehicle 10 is viewed in the traveling direction (the X direction). The transferer 13 can move the article M held by the holder 15 between the storing position P1 and the exiting position P2 by having the lift driver 17 feed out or take up the suspenders 15b. The storing position P1 is a position where the article M is accommodated in a space sandwiched between the inner walls 23a of the cover members 23. The exiting position P2 is a position where the article M has exited the main body 12 downward.

The transferer 13 moves the movable plates 18a of the lateral extender 18 along a guide, not shown in the drawings, by a driving force from a driver, not shown in the drawings. Thereby, the transferer 13 can move the article M held by the holder 15 between the storing position P1 and the exiting position P3. The storing position P1 is as described above. The exiting position P3 is a position where the article M has exited the main body 12 laterally (in the Y direction), that is, to the lateral side of the traveling direction. The exiting position P3 is set on both lateral sides (on the +Y side and the −Y side) of the traveling direction of the main body 12.

The rotator 19 rotates the holder 15 about the vertical (Z direction) rotation axis AX. The rotator 19 can freely be raised or lowered by the lift driver 17. As shown in FIG. 4, in the state where the article M held by the holder 15 is positioned at the exiting position P2 or the exiting position P3, the rotator 19 can rotate the holder 15 about the rotation axis AX by the predetermined angle θ or more mentioned above (see FIG. 2).

Figure 5:
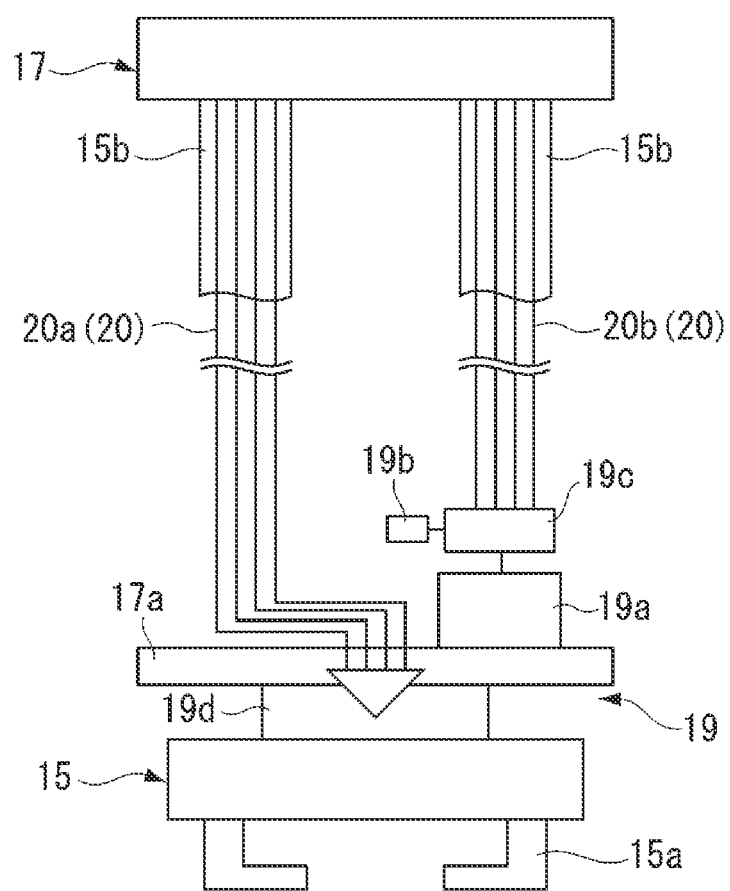
FIG. 5 is a diagram schematically showing a rotator.

FIG. 5 is a diagram schematically showing the rotator 19. The rotator 19 includes a drive source 19a, a sensor 19b, a control board 19c, and a turning shaft 19d. As the drive source 19a, for example, an electric motor or the like capable of turning the turning shaft 19d is used. The sensor 19b detects the amount of rotation and so forth of the turning shaft 19d and so forth. The control board 19c controls the operation of the drive source 19a on the basis of control signals from the controller 14 and detection results of the sensor 19b. The turning shaft 19d can rotate relative to a portion 17a which is raised or lowered by the lift driver 17 and is locked relative to the portion 17a in the vertical direction (the Y direction). A lower end of the turning shaft 19d is attached to the holder 15, and the holder 15 (and the article M) can be turned by rotating the turning shaft 19d. The drive source 19a, the sensor 19b, and the control board 19c are arranged in the portion 17a.

The rotator 19 is arranged on top of the holder 15 and moves in the vertical direction (the Z direction) together with the holder 15 by driving the lift driver 17. As described above, the rotator 19 can, by being arranged on top of the holder 15, make the rotated part smaller compared to performing rotation with inclusion of the lift driver 17. As a result, it is possible to miniaturize the rotator 19.

The rotator 19 is not limited to being arranged on top of the holder 15. For example, the rotator 19 may be arranged between the movable plates 18a of the lateral extender 18 and the lift driver 17. Even in this configuration, in the state where the article M is positioned at the exiting position P2 and the exiting position P3, it is possible, by driving the rotator 19, to rotate the holder 15 with inclusion of the lift driver 17 and rotate the article M held by the holder 15 about the rotation axis AX by the predetermined angle θ or more.

As shown in FIG. 5, cables 20 include holder cables 20a which are electrically connected to the holder 15, and rotator cables 20b which are electrically connected to the rotator 19. The holder cables 20a and the rotator cables 20b are supported by different suspenders 15b. The holder cables 20a include a control cable for controlling the holder 15 and a power supply cable for supplying electric power to the holder 15. The holder cables 20a are connected to the turning shaft 19d of the rotator 19, and supply control signals or electric power to the holder 15 via the turning shaft 19d. The rotator cables 20b include a control cable for controlling the rotator 19 and a power supply cable for supplying electric power to the rotator 19. The rotator cables 20b are connected to the control board 19c. As described above, by arranging the cables 20 on the suspenders 15b, it is possible to supply control signals or electric power to the holder 15 and the rotator 19 with a compact configuration.

As shown in FIG. 1, the controller 14 controls the operation of each part of the traveler 11 and the transferer 13. Upon instruction of the controller 14, the traveler 11 travels in the state where the holder 15 is placed at the storing position P1 by the mover 16. When the traveler 11 stops, the stopping is performed by reading, with a sensor provided in the overhead transport vehicle 10, a stop indicator which is provided on or in the vicinity of the track R and corresponds to the transfer destination. When receiving or delivering the article M from or to the transfer destination by the transferer 13, upon instruction of the controller 14, the rotator 19 rotates the holder 15 by the predetermined angle θ or more in the state where the holder 15 is placed at the exiting positions P2, P3 by the mover 16 to thereby rotate the article M held by the holder 15 by the predetermined angle θ or more.

Figure 6:
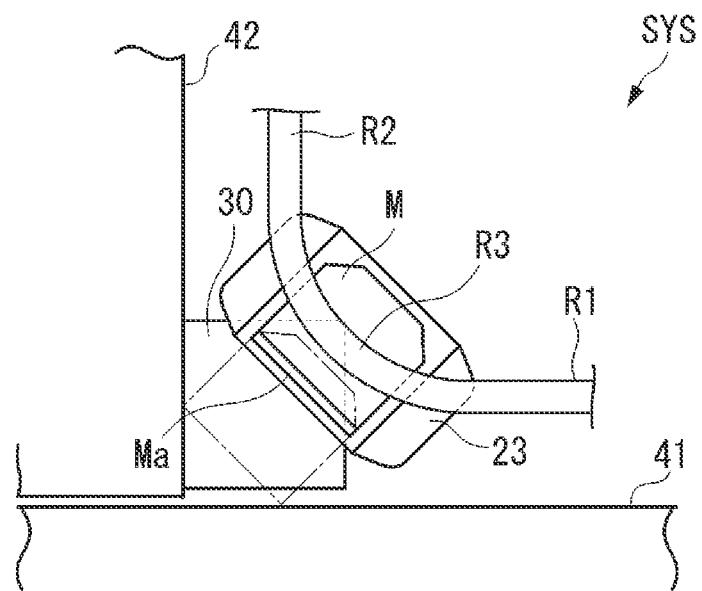
FIG. 6 shows a transport system and a control method for an overhead transport vehicle according to an example where
Figure 6:
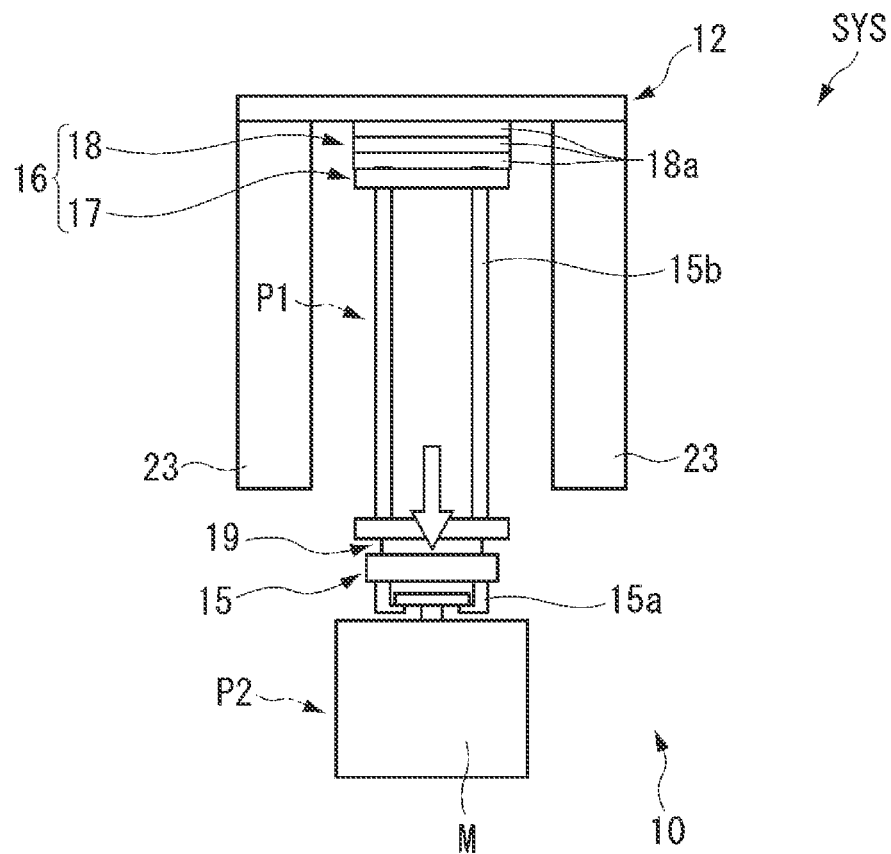
Figure 7:
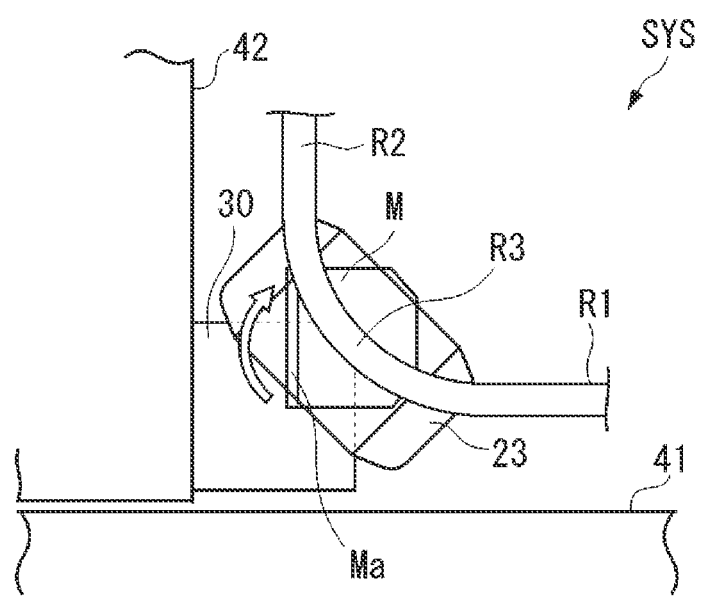
FIG. 7 is a diagram, which follows FIG. 6, where
Figure 7:
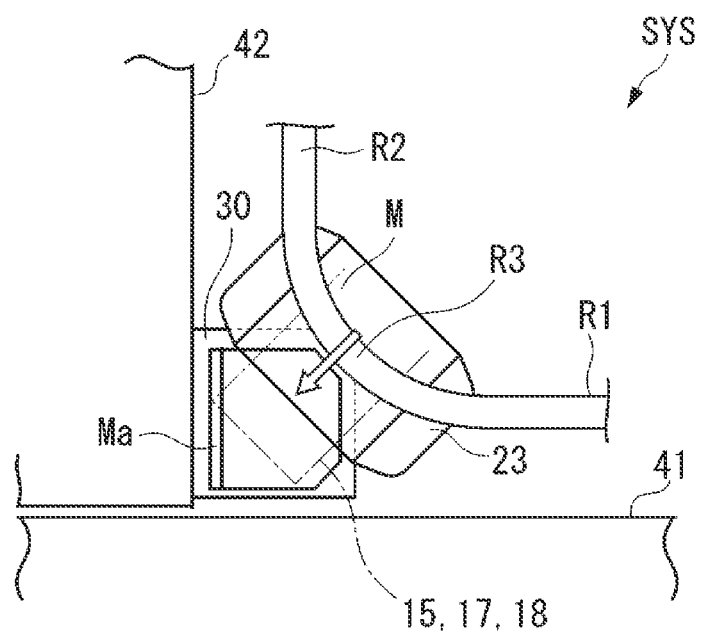
Figure 8:
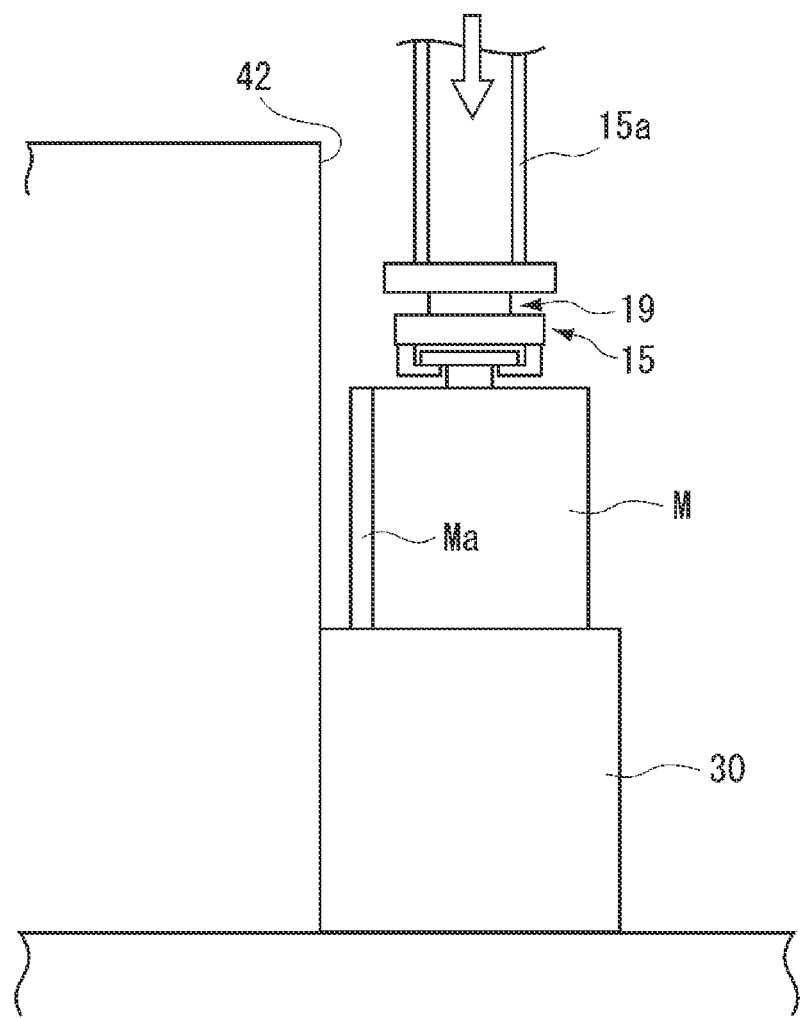
FIG. 8 is a diagram, which follows FIG. 7, and shows a state of the article having been lowered and placed on a load port.

FIGS. 6 to 8 are diagrams showing an example of a transport system SYS and a control method for the overhead transport vehicle 10. The transport system SYS includes the track R and the overhead transport vehicle 10. The overhead transport vehicle 10 transports the article M to a load port (transfer destination) 30 of a processing tool 42, for example. On the load port 30, the article M is placed in a prescribed orientation (for example, an orientation in which the lid Ma faces the processing tool 42). The overhead transport vehicle 10 receives the article M from the load port 30 and transports it to another location. The load port 30 of the processing tool 42 is described as an example of the transfer destination, however, the transfer destination may be a receiving/delivering port of an automated warehouse, a storage rack or the like. Examples of the processing tool 42 include a film former, a coater/developer, an exposer, and an etcher, and the processing tool 42 is an apparatus which performs various processes during the course of manufacturing various types of devices (for example, semiconductor devices).

In this example, the processing tool 42 is installed in the vicinity of a side wall 41 of a building. For example, as shown in FIG. 6, the processing tool 42 is installed so that the front-side wall of the processing tool 42 is perpendicular to the side wall 41 of the building. With this configuration, the load port 30 of the processing tool 42 is arranged in the vicinity of the side wall 41. A taking-in port of the load port 30 which is opened or closed to take a workpiece (such as a semiconductor wafer) into the processing tool 42 from the article M is provided substantially flush with the front-side wall of the processing tool 42. That is to say, the taking-in port is provided to be perpendicular to the side wall 41 of the building. The workpiece is taken out from or taken into the article M placed on the load port 30 and is taken into or taken from the processing tool 42 in the state where the lid Ma of the article M has been removed and the portion on which the lid Ma was mounted has been aligned with the taking-in port of the load port 30. Thus, the article M is preliminarily determined to be placed on the load port 30 in the orientation so that the lid Ma is aligned with the taking-in port of the load port 30 (in other words, in the orientation which brings the lid Ma of the article M to a position parallel with and in the vicinity of the taking-in port of the load port 30). This orientation corresponds to the prescribed orientation at the time of placing the article M on the load port 30.

The track R includes straight sections R1, R2 arranged along the side wall 41 and the processing tool 42, and a curved section R3 arranged at a position which deviates from the upper side of the load port 30 of the processing tool 42. The curved section R3 is provided to connect to the straight section R1 along the side wall 41 and the straight section R2 along the processing tool 42. The curved section R3 is provided to curve from the direction of the straight section R1 and be away from the side wall 41. The straight sections R1, R2 and the curved section R3 are arranged at positions at which the side wall 41 and the processing tool 42 are not interfered when the overhead transport vehicle 10 travels.

First, an operation when the overhead transport vehicle 10 transports the article M to the load port 30 is described. As shown in FIG. 6(A), the traveler 11 stops at the curved section R3 of the track R according to an instruction from the controller 14. In such an example, the overhead transport vehicle 10 stops in the state of not being parallel to the side wall 41 or the processing tool 42 as viewed from above. Therefore, the article M stored in the main body 12 is in a state of not being parallel to the front-side wall of the processing tool 42, being deviated from above the load port 30, and having rotated from the prescribed orientation of the load port 30. In this state, the controller 14 causes the transferer 13 to execute transportation of the article M to the load port 30 arranged below the curved section R3.

If the article M is first projected laterally by the lateral extender 18 and then rotated to be adapted to the load port 30, the corner part of the article M comes into contact with the side wall 41 as shown by the chain line in FIG. 6(A). Also, if the article M is rotated by the rotator 19 to be adapted to the load port 30 in the state of being placed at the storing position P1 before projecting the article M laterally, the article M contacts the inner wall 23a of the cover member 23 as described above. Therefore, the controller 14 performs control as shown in FIG. 6(B) and thereafter to avoid the article M from contacting the side wall 41 and avoids the article M from contacting the inner walls 23a of the cover members 23.

First, as shown in FIG. 6(B), the lift driver 17 lowers the holder 15 to place the article M at the exiting position P2. Since there is no high obstacle below the curved section R3, it is possible to avoid the article M from contacting other objects when the article M is lowered to the exiting position P2 from the main body 12 of the overhead transport vehicle 10. It is at least possible to avoid the article M from contacting with the side wall 41 or the processing tool 42 when the article M is lowered from the storing position P1 to the exiting position P2.

After the article M has been placed at the exiting position P2, as shown in FIG. 7(A), the rotator 19 rotates the holder 15 upon instruction of the controller 14 to rotate the article M about the rotation axis AX (see FIG. 2) and align the article M with the prescribed orientation of the load port 30 serving as the transfer destination of the article M. That is to say, the article M is rotated to the orientation which makes the taking-in port of the load port 30 (the front-side wall of the processing tool 42) parallel with the lid Ma of the article M. In such an example, the holder 15 is rotated while the article M is placed at the exiting position P2 where the article M does not interfere with the cover members 23, and it is therefore possible to rotate the article M by the predetermined angle θ or more. The article M is rotated so that the lid Ma faces the processing tool 42. Therefore, even when the lid Ma is oriented in any direction at the storing position P1, it is possible to make the lid Ma face the processing tool 42 in the prescribed orientation of the load port 30 by having the rotator 19 rotate the article M.

After having aligned the orientation of the article M with the prescribed orientation of the load port 30, as shown in FIG. 7(B), the lateral extender 18 advances, upon instruction of the controller 14, the lift driver 17 (the holder 15) to a position at which the article M is directly above the load port 30. In such an example, since the article M is rotated to be adapted to the load port 30, the article M does not contact the obstacles such as the side wall 41 and the processing tool 42. Since the dimensions of the lateral extender 18, the lift driver 17, and the holder 15 as measured in the traveling direction are smaller than the dimension of the article M as measured in the traveling direction (see FIG. 3), it is possible to prevent the lateral extender 18 and so forth from contacting obstacles such as the side wall 41 and the processing tool 42 when the lateral extender 18 is advanced.

After the article M has been positioned directly above the load port 30, as shown in FIG. 8, the lift driver 17 lowers the holder 15 upon instruction of the controller 14 and places the article M on the load port 30, and then, the article M is released from being held by the holder 15. Through a series of these operations, the overhead transport vehicle 10 completes the transportation of the article M to the load port 30. After having placed the article M on the load port 30, the holder 15 is raised by the lift driver 17 and the lateral extender 18 is retracted into the main body 12. Thereby, the overhead transport vehicle 10 is brought to a travelable state.

Next, here is described an operation when the overhead transport vehicle 10 receives the article M placed on the load port 30. The traveler 11 stops in the curved section R3 of the track R in a manner similar to that when placing the article M on the load port 30. The holder 15 is in the state of not holding the article M. In this state, the holder 15 is lowered to hold the article M in a manner similar to the operation shown in FIGS. 6(B) to 8. Since the holder 15 is not holding the article M, the lateral extender 18 may first advance the holder 15 to directly above the article M, then the rotator 19 may rotate the holder 15 to be adapted to the article M, and then, the lift driver 17 may lower the holder 15.

After the holder 15 holds the article M, the holder 15 is raised by the lift driver 17 and holds the article M at the height of the exiting position P2. Next, the lateral extender 18 retracts the lift driver 17 (the holder 15) to the lower side of the main body 12. As a result, the article M is in a state similar to that in FIG. 6(B). Next, the holder 15 is rotated by the rotator 19 to rotate the article M about the rotation axis AX, and the orientation of the article M is aligned with the arrangement of the cover members 23 of the main body 12. Then, the lift driver 17 raises the holder 15 to place the article M at the storing position P1. Through a series of these operations, the overhead transport vehicle 10 completes the receiving of the article M placed on the load port 30.

As described above, the clearance between the article M stored in the main body 12 and the cover member 23 is narrow and the article storage space formed by the cover members 23 is small, and it is therefore possible to miniaturize the main body 12 and the overhead transport vehicle 10. When receiving or delivering the article M from or to the transfer destination (the load port 30) by the transferer 13, rotation by the predetermined angle θ or more is allowed when the article M is at the exiting position P2, and it is therefore possible to prevent the article M from contacting the cover members 23 of the main body 12. Since the holder 15 can be rotated by the predetermined angle θ or more at the exiting position P2, the article M can be received from or delivered to the load port 30 arranged in the vicinity of the side wall 41 without the article M contacting the side wall 41. Since the article M can still be appropriately received or delivered even when the load port 30 is in the vicinity of the side wall 41 of the building, the processing tool 42 (the load port thereof) can be arranged in the vicinity of the side wall 41 and the efficiency of the space in the building can be improved.

Figure 9:
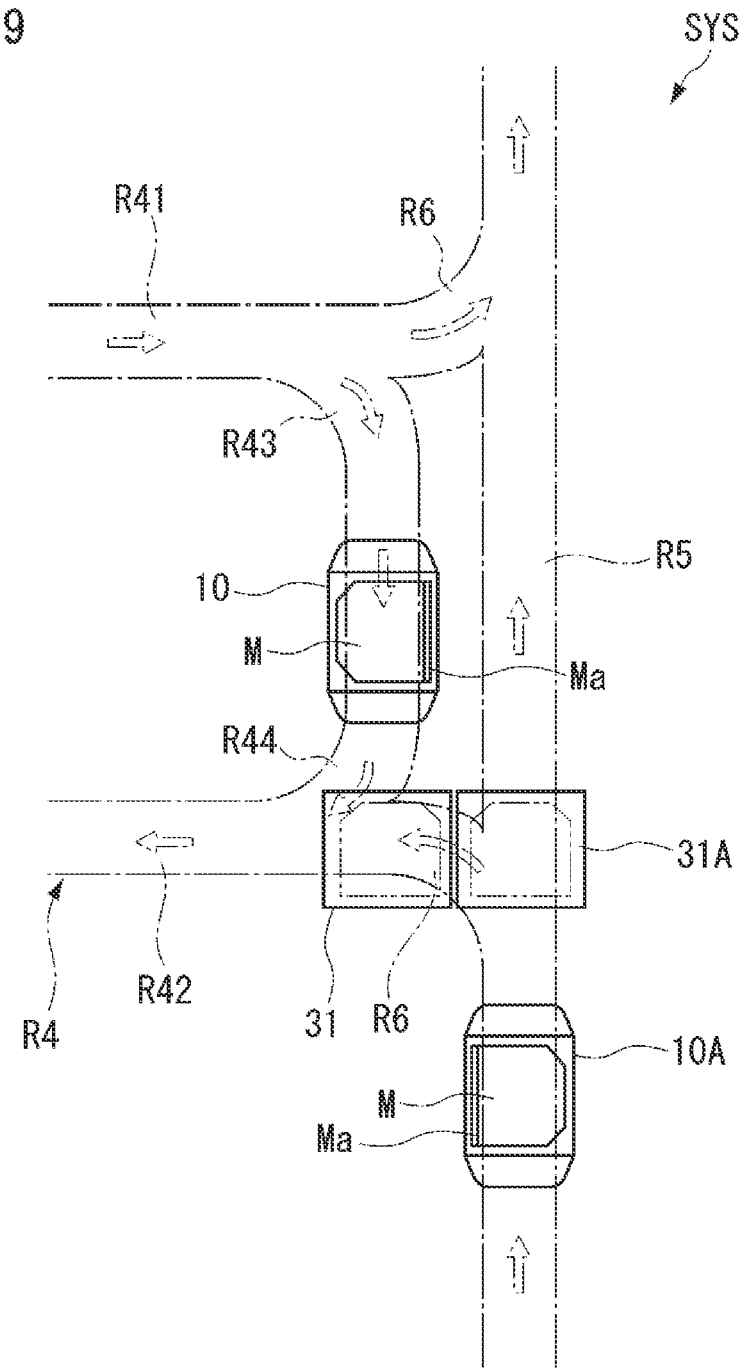
FIG. 9 is a diagram showing another example of the overhead transport system and the control method for an overhead transport vehicle.
Figure 10:
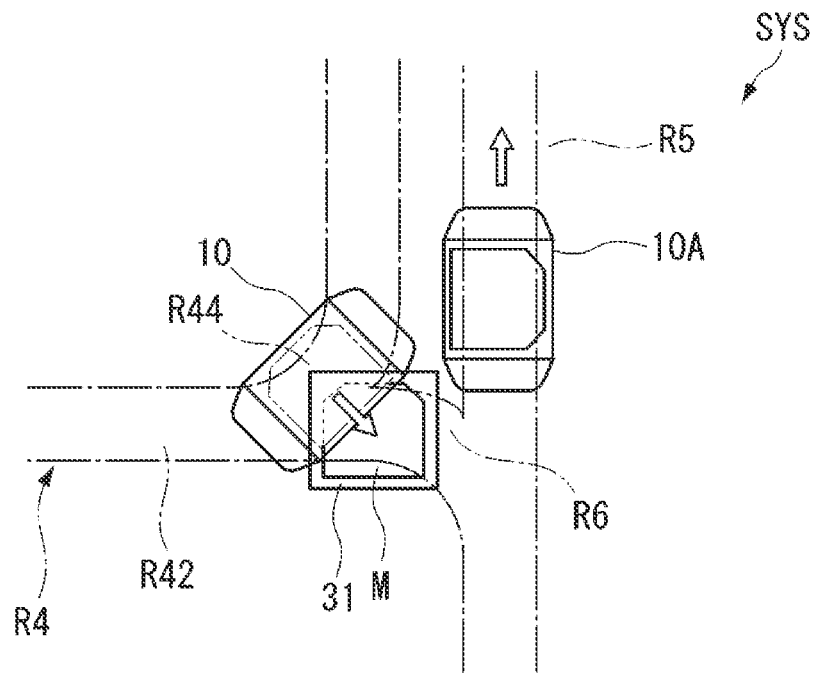
FIG. 10 shows another example of the control method for an overhead transport vehicle where
Figure 10:
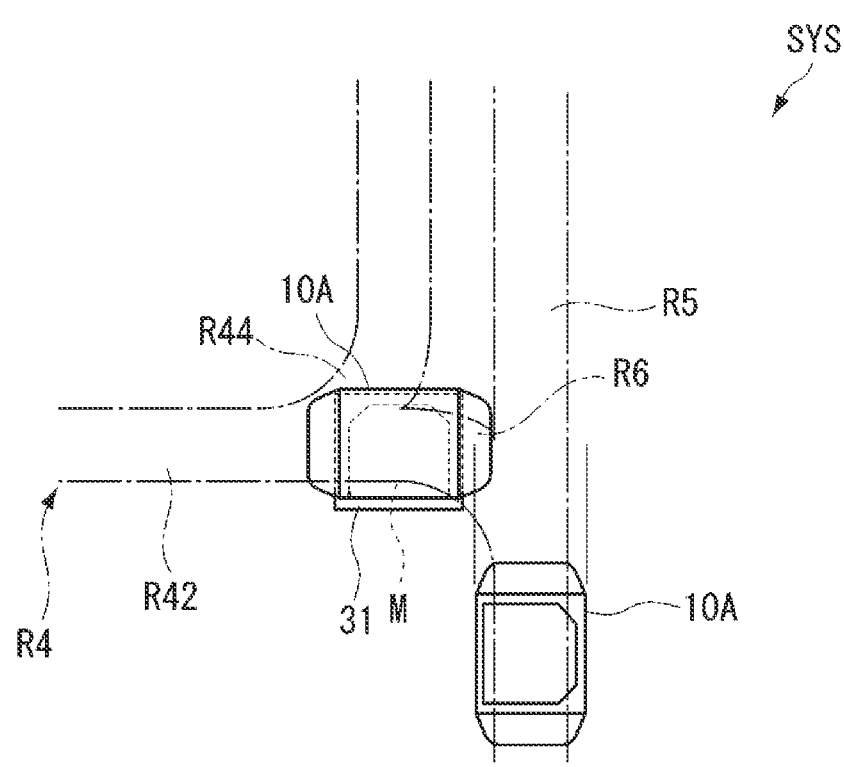

The example described above shows receiving or delivering the article M from or to the load port 30 in the vicinity of the side wall 41. FIGS. 9 and 10 show receiving or delivering of the article M from or to another load port 31. Since the configurations of overhead transport vehicles 10 and 10A are the same as that in the example described above, the same symbols are assigned thereto, and the descriptions thereof are omitted.

FIGS. 9 and 10 are diagrams showing another example of the control method for the overhead transport vehicle 10. The overhead transport vehicle 10 transports the articles M to load ports 31, 31A of a processing tool, a storage rack, or an automated warehouse not shown in the drawings. The overhead transport vehicle 10 receives the articles M from the load ports 31, 31A and transports them to other locations.

Here is described an example of when the articles M are placed on the load ports 31, 31A so that the lid Ma of each article M faces rearward in the traveling direction of an external track R5 described later. That is to say, here is shown an example in which the orientation of the article M prescribed at the load ports 31, 31A makes the lid Ma rear-facing in the traveling direction of the external track R5. The direction of the lid Ma is not limited to the example shown in FIG. 9, and the article M may be placed so that the lid Ma may face another direction.

In the example shown in FIGS. 9 and 10, the track R has a circular track R4 and the external track R5. For example, the circular track R4 is provided along a processing tool, a storage rack, or an automated warehouse not shown in the drawings. The circular track R4 has straight sections R41, R42 and curved sections R43, R44. The external track R5 is arranged outside the circular track R4. The external track R5 is connected to the circular track R4 by two connection tracks R6. One of the two connection tracks R6 is a track for entering the circular track R4 from the external track R5, and the other connection track R6 is a track for exiting from the circular track R4 to the external track R5. The load port 31 is arranged at a position on the lower side of the connection track R6 and on the lower and lateral side of a curved section R44. The load port 31A is arranged at a position on the lower side of the external track R5.

As shown in FIG. 10(A), when the overhead transport vehicle 10 transports the article M to the load port 31, the traveler 11 stops at the curved section R44 of the circular track R4 upon instruction of the controller 14. In this state, the overhead transport vehicle 10 receives or delivers the article M from or to the load port 31 arranged on the lower and lateral side of the curved section R44, for example, in a procedure similar to that in FIGS. 6 to 8 described above. The operation of the overhead transport vehicle 10 is controlled by the controller 14, and this is similar to that described above.

First, the lift driver 17 lowers the holder 15 to place the article M at the exiting position P2. After the article M has been placed at the exiting position P2, the rotator 19 rotates the holder 15 about the rotation axis AX and aligns the orientation of the article M with the orientation prescribed at the load port 31. At this time, the holder 15 is rotated while the article M is still placed at the exiting position P2, and it is therefore possible to rotate the holder 15 by the predetermined angle θ or more. After having aligned the orientation of the article M with the orientation prescribed at the load port 31, the lateral extender 18 advances the lift driver 17 (the holder 15) to a position at which the article M is directly above the load port 31. Then, the lift driver 17 lowers the holder 15 to place the article M on the load port 31. Through a series of these operations, the overhead transport vehicle 10 completes the transportation of the article M to the load port 31.

If there is no obstacle in the vicinity of the load port 31, the lateral extender 18 may advance the lift driver 17 (the holder 15) to the position at which the article M is directly above the load port 31, and then the rotator 19 may align the orientation of the article M with the orientation required at the load port 31. Then, the lift driver 17 may lower the holder 15 to place the article M on the load port 31.

Also, when the overhead transport vehicle 10 receives the article M placed on the load port 31, the operation is performed in a manner similar to that described above. First, the traveler 11 is stopped in the curved section R44 of the circular track R4, and the holder 15 is lowered through a procedure similar to that described above to hold the article M placed on the load port 31. After the holder 15 holds the article M, the holder 15 is raised by the lift driver 17 and holds the article M at the height of the exiting position P2. Next, the lateral extender 18 retracts the lift driver 17 (the holder 15) to the lower side of the main body 12. Next, the holder 15 is rotated by the rotator 19 to align the orientation of the article M with the arrangement of the cover members 23 of the main body 12. Then, the lift driver 17 raises the holder 15 to place the article M at the storing position P1. Through a series of these operations, the overhead transport vehicle 10 completes the receiving of the article M placed on the load port 31.

The load port 31 is arranged on the lower side of the connection track R6. For this reason, for example, as shown in FIG. 10(B), in the state where the overhead transport vehicle 10 has moved to the connection track R6 from the external track R5 and the traveler 11 has been stopped on the connection track R6, the transferer 13 can receive or deliver the article M from or to the load port 31. However, in such an example, a part of the overhead transport vehicle 10 (for example, the cover member 23) may protrude to the external track R5 side in some examples. As a result, the other overhead transport vehicle 10A traveling on the external track R5 may sometimes be hindered, and it is therefore necessary to temporarily stop the traveling of the other overhead transport vehicle 10A.

In the example shown in FIG. 10(A), the overhead transport vehicle 10 traveling on the circular track R4 receives or delivers the article M from or to the load port 31, and therefore, part of the overhead transport vehicle 10 does not become an obstacle to the other overhead transport vehicle 10A traveling on the external track R5, and the traveling of the other overhead transport vehicle 10A need not be stopped. For this reason, it is possible to suppress congestion of the overhead transport vehicle 10A on the external track R5.

In the example shown in FIG. 10(A), while the overhead transport vehicle 10 receives or delivers the article M from or to the load port 31, the overhead transport vehicle 10A traveling on the external track R5 can receive or deliver the article M from or to the load port 31A at the same time. For example, at the timing when the overhead transport vehicle 10 receives or delivers the article M from or to the load port 31, the traveler 11 of the overhead transport vehicle 10A stops above the load port 31A on the external track R5, and in this state, the transferer 13 can receive or deliver the article M from or to the load port 31A.

The lift driver 17 of the overhead transport vehicle 10A lowers the holder 15 to place the article M at the exiting position P2. Then, the rotator 19 rotates the holder 15 to align the orientation of the article M with the load port 31A. For example, the rotator 19 rotates the holder 15 so that the lid Ma of the article M faces rearward in the traveling direction of the external track R5. In the overhead transport vehicle 10A also, since the article M rotates in the state of having been placed at the exiting position P2, it is possible to rotate the article M by the predetermined angle θ or more. After having aligned the orientation of the article M with the load port 31A, the lift driver 17 lowers the holder 15 to place the article Mon the load port 31A. Through a series of these operations, the overhead transport vehicle 10A completes the transportation of the article M to the load port 31A.

We next describe an example where the overhead transport vehicle 10A receives the article M placed on the load port 31A. As with the above description, the overhead transport vehicle 10A causes the traveler 11 to stop above the load port 31A and lowers the holder 15 to hold the article M.

Then, the lift driver 17 raises the holder 15 to place the article M at the exiting position P2. Next, the rotator 19 rotates the holder 15 to align the orientation of the article M with the arrangement of the cover members 23 of the main body 12. Then, the lift driver 17 raises the holder 15 to place the article M at the storing position P1. Through a series of these operations, the overhead transport vehicle 10A completes the receiving of the article M placed on the load port 31A.

As described above, in the example shown in FIGS. 9 and 10, when the overhead transport vehicle 10 receives or delivers the article M from or to the load port 31, it is possible to ensure smooth traveling of the overhead transport vehicle 10A on the external track R5 without the overhead transport vehicle 10 becoming an obstacle to the overhead transport vehicle 10A traveling on the external track R5. Since the overhead transport vehicle 10A traveling on the external track R5 can receive or deliver the article M from or to the load port 31A at the same time when the overhead transport vehicle 10 receives or delivers the article M from or to the load port 31, the efficiency of transporting the articles M can be improved.

The example above shows the load ports 30, 31, 31A installed on the floor surface of the building. However, there are some examples where the article M is received from or delivered to a rack 32 serving as a transfer destination arranged in the upper part of the building and positioned at a predetermined height from the floor surface. FIGS. 11 to 17 are diagrams showing another example of the control method for the overhead transport vehicles 10 (10A, 10B). In FIGS. 12 to 17, (A) of each figure is a downward view from above (in the −Z direction), and (B) of each figure is a view from the traveling direction (the X direction). Since the configurations of the overhead transport vehicles 10 (10B, 10C) are the same as that in the example described above, the same symbols are assigned thereto, and the descriptions thereof are omitted.

Figure 11:
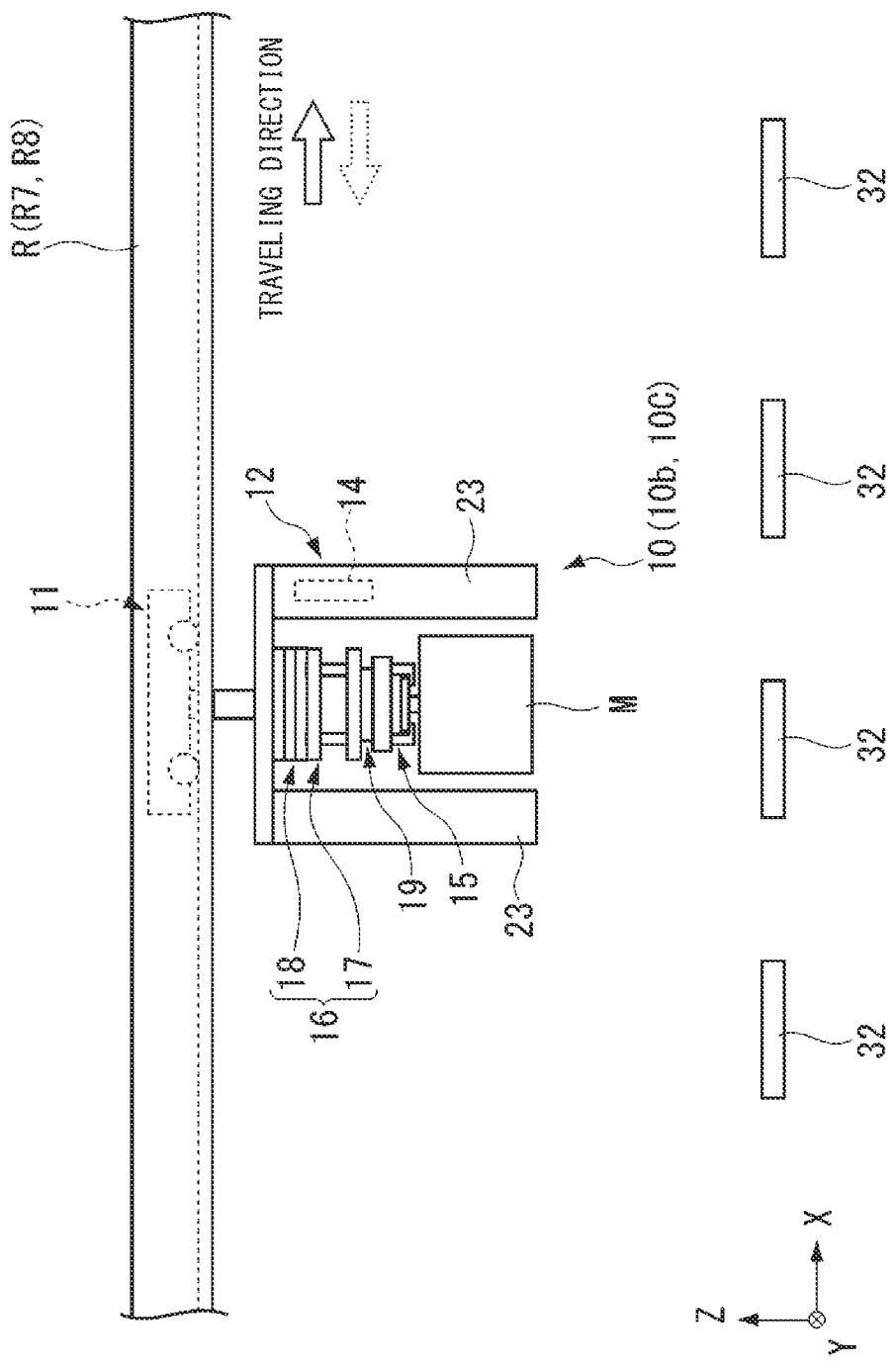
FIG. 11 is a diagram showing still another example of the control method for an overhead transport vehicle.
Figure 12:
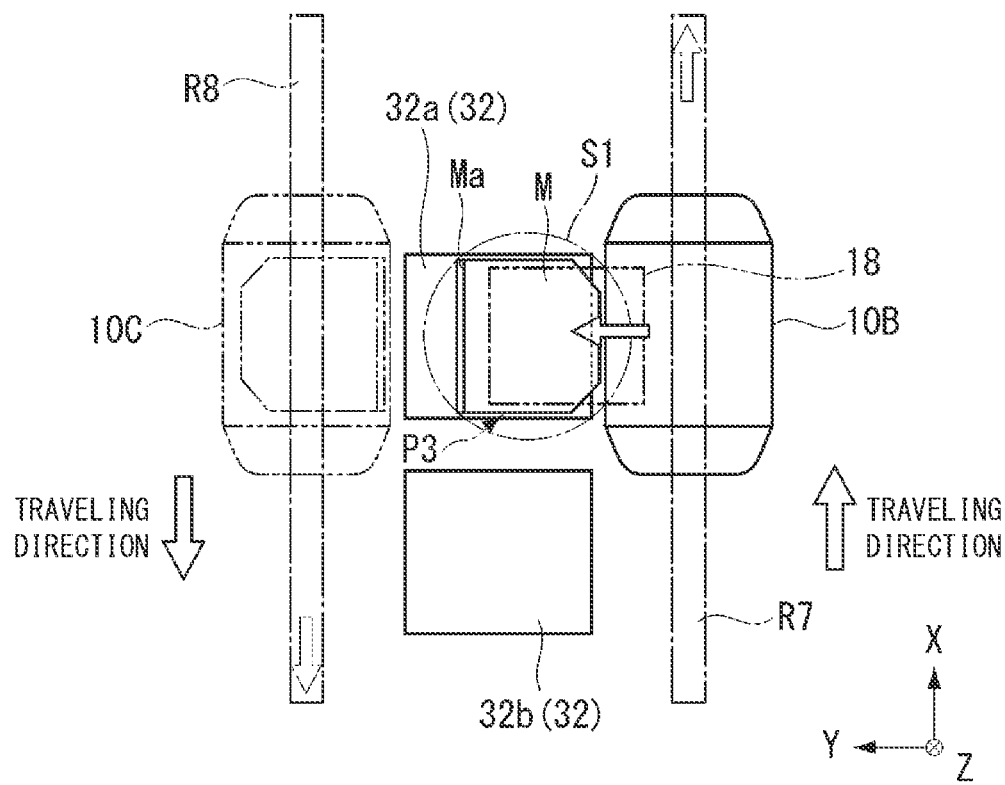
FIG. 12 shows a state where the overhead transport vehicle has advanced the article to the exiting position, where
Figure 12:
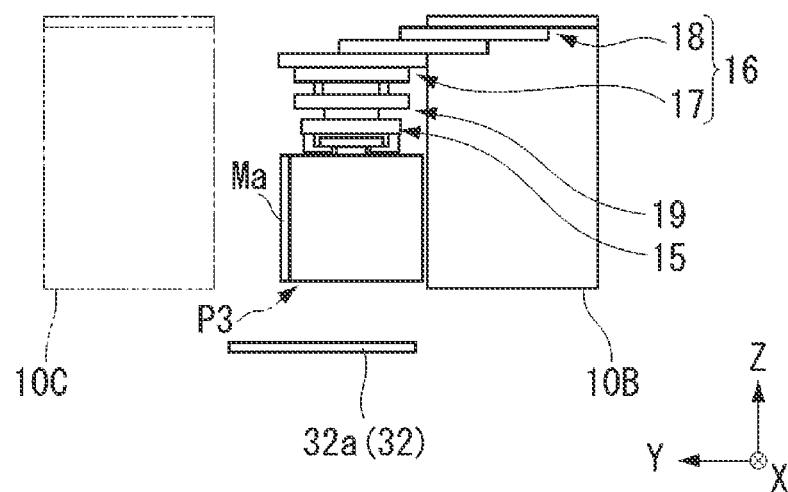
Figure 13:
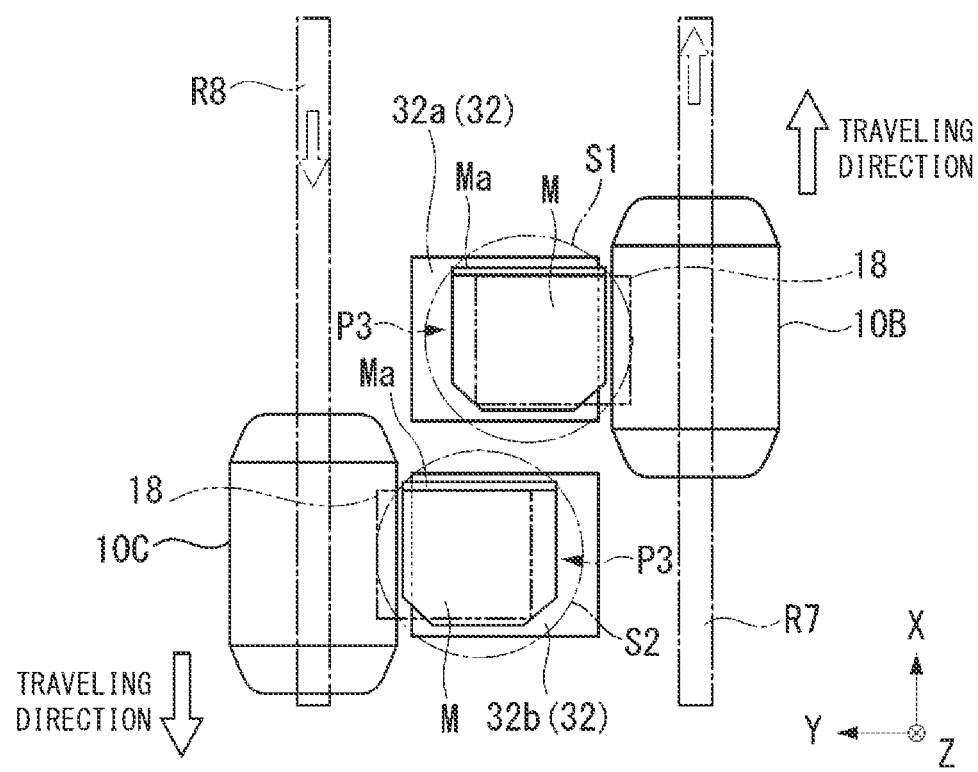
FIG. 13 is a diagram, which follows FIG. 12, and shows a state of the article having been rotated, where
Figure 13:
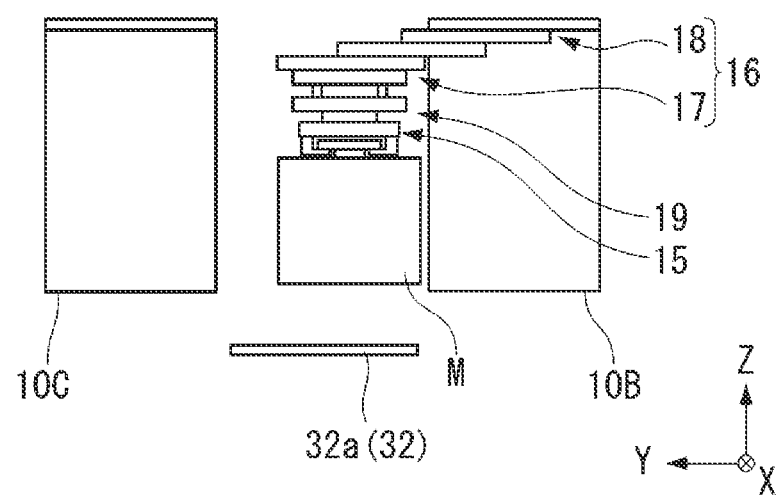
Figure 14:
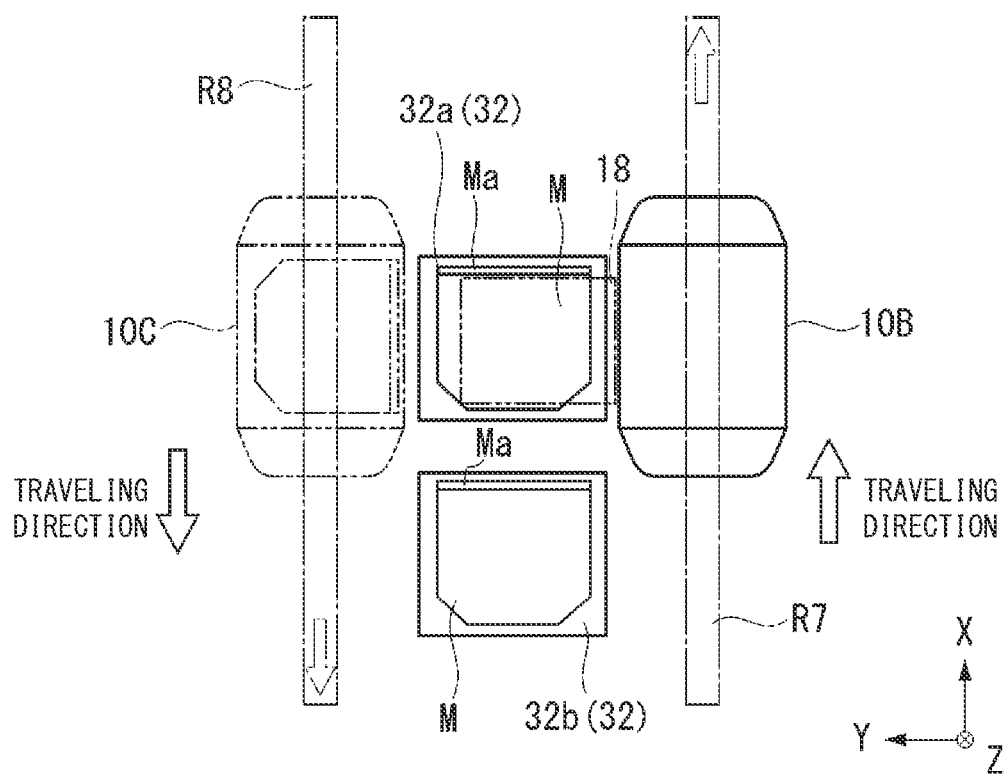
FIG. 14 is a diagram, which follows FIG. 13, and shows a state of the article having been further advanced and then being lowered and placed on a rack, where
Figure 14:
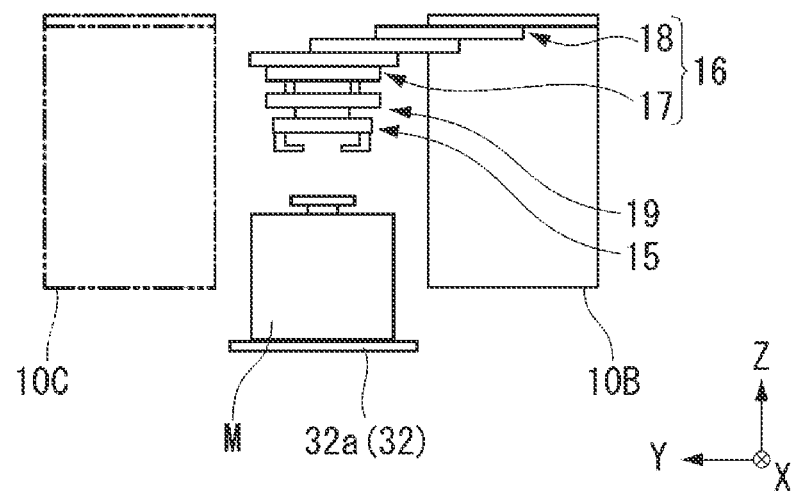
Figure 15:
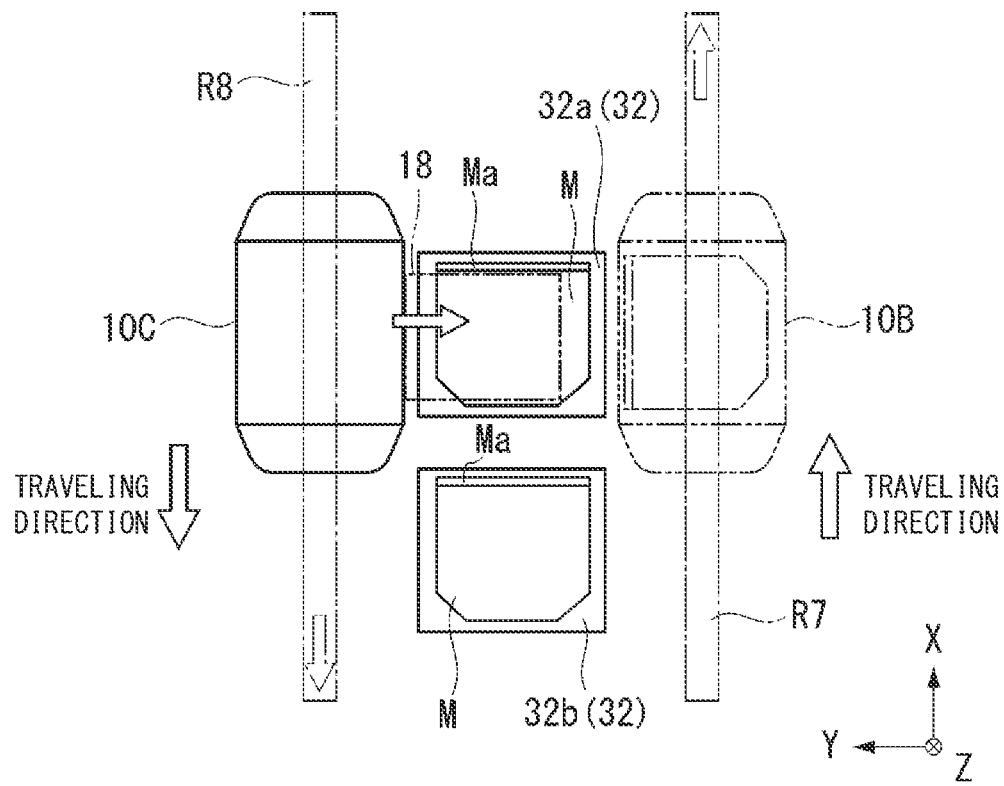
FIG. 15 shows a state where the overhead transport vehicle of another track is holding the article on the rack, where
Figure 15:
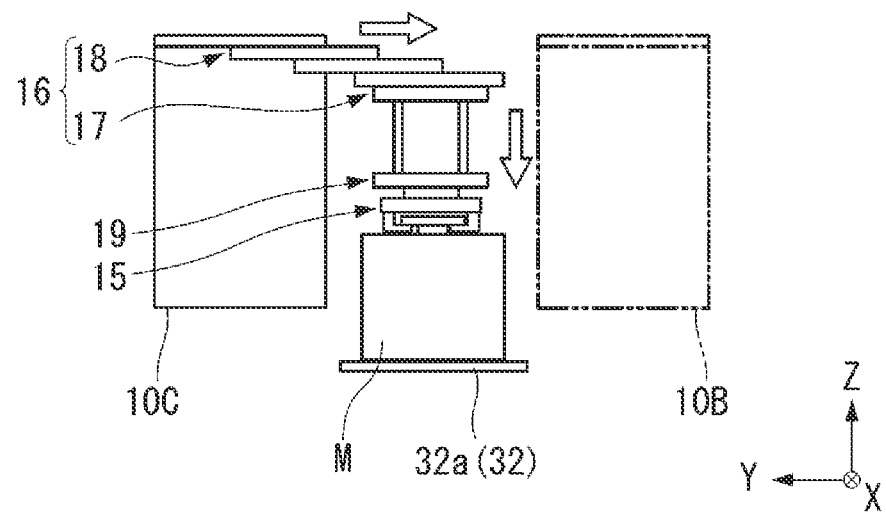
Figure 16:
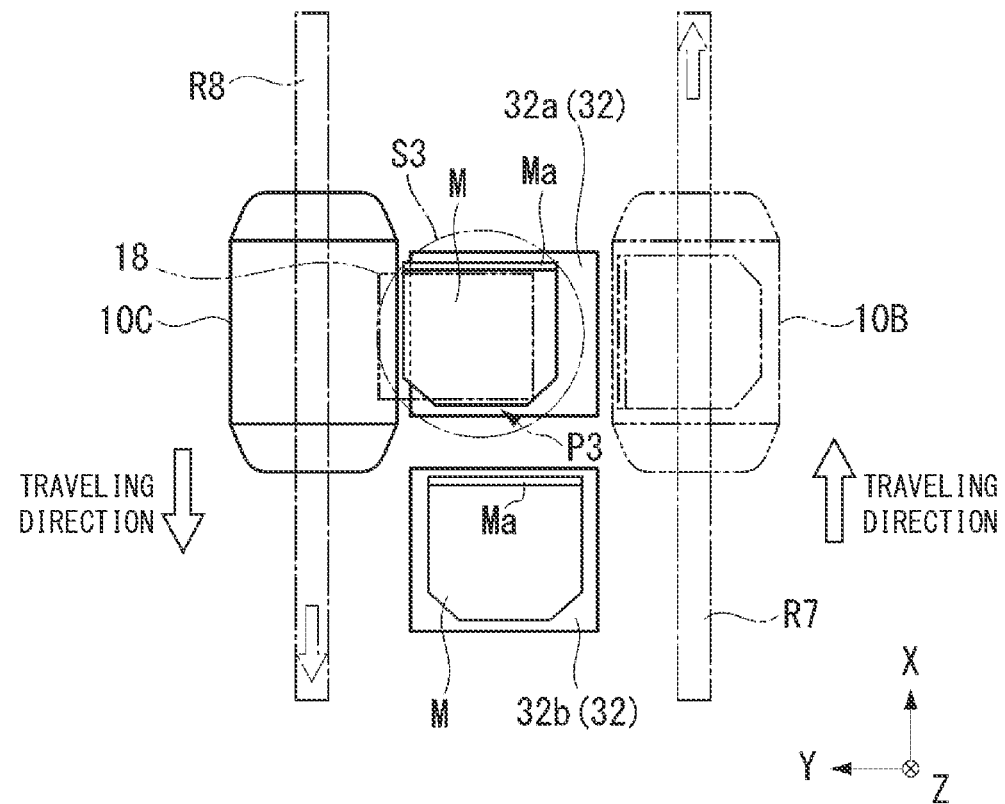
FIG. 16 is a diagram, which follows FIG. 15, and shows a state of the article having been raised and returned to the exiting position, where
Figure 16:
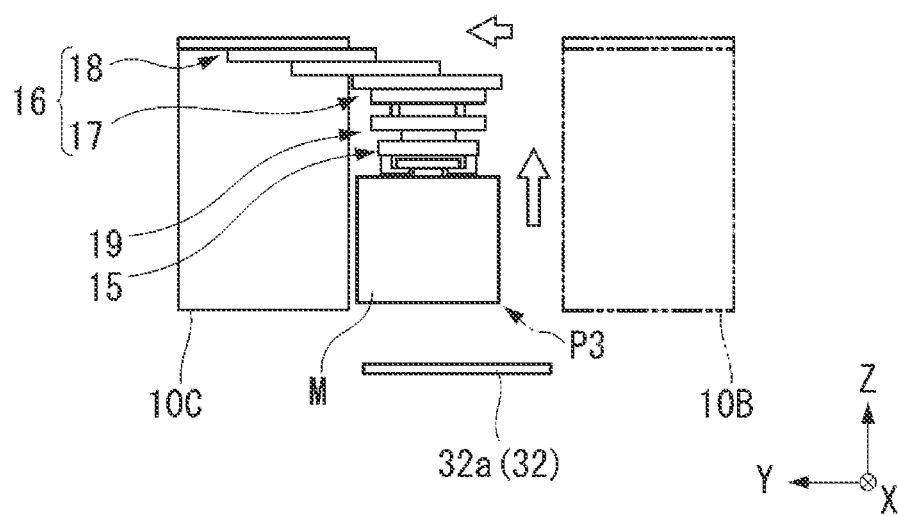
Figure 17:
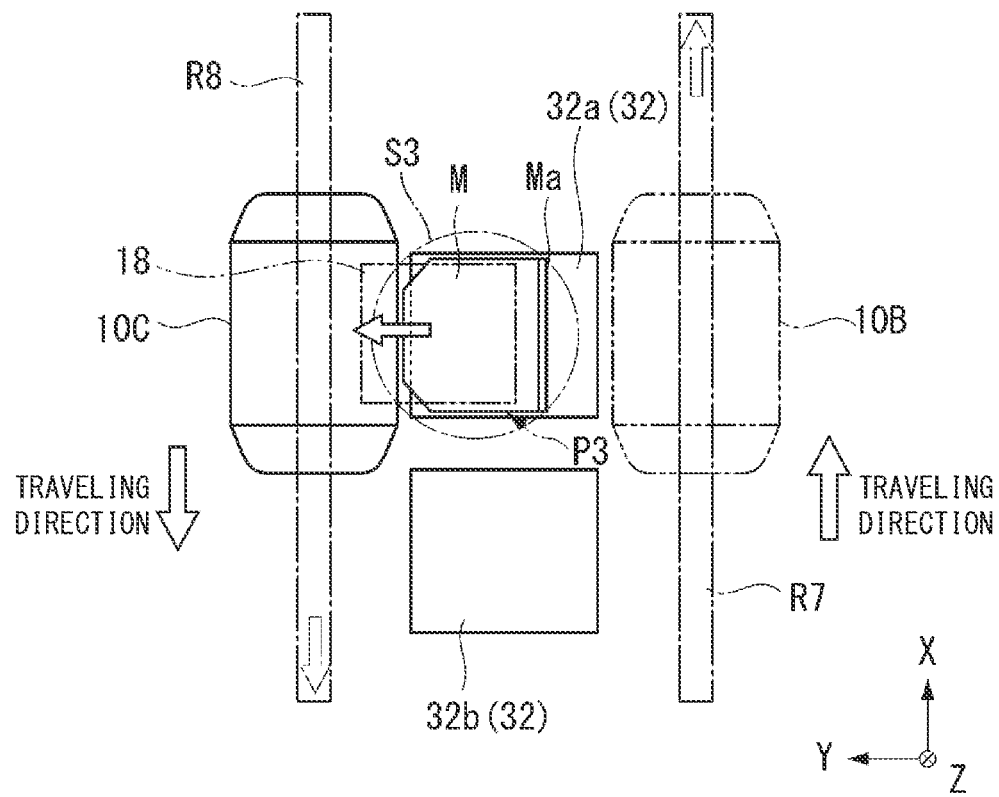
FIG. 17 is a diagram, which follows FIG. 16, and shows a state of the article having been rotated, where
Figure 17:
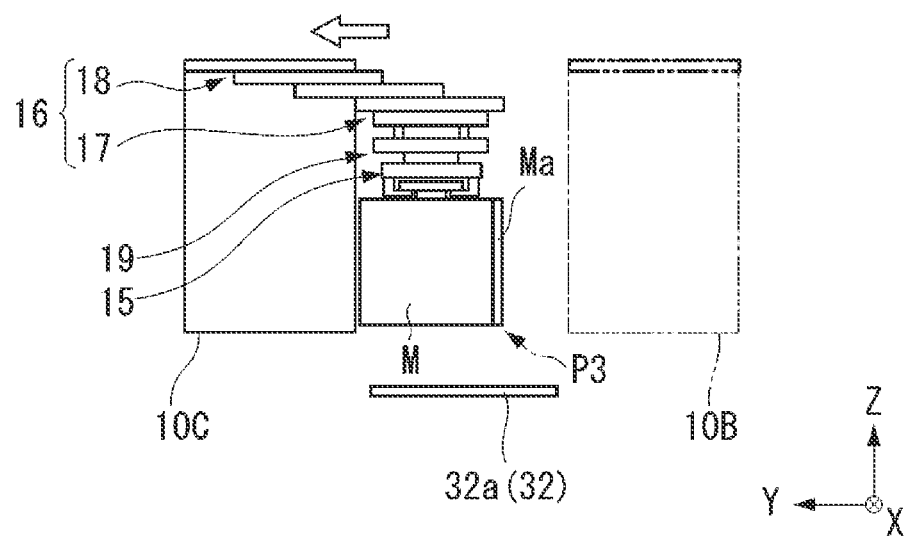

As shown in FIGS. 11 and 12, the track R has straight tracks R7, R8. As shown in FIG. 12, the straight tracks R7, R8 each extend along the X direction, and are arranged in parallel with each other while having the rack 32 therebetween as viewed from above. A plurality of racks 32 are arranged in line in the X direction to follow the straight tracks R7, R8. Hereinafter, when the plurality of racks 32 are distinguished from one another, they are represented as racks 32a, 32b.

As shown in FIG. 12, the overhead transport vehicles 10 travel in directions opposite to each other on the straight tracks R7, R8. Hereinafter, the overhead transport vehicles 10 are described as an overhead transport vehicle 10B traveling on the straight track R7 and an overhead transport vehicle 10C traveling on the straight track R8. The overhead transport vehicles 10B, 10C transport the article M to each of the plurality of racks 32. The overhead transport vehicles 10 each receive the article M from each of the racks 32 and transport it to another location. The article M can also be received or delivered between the overhead transport vehicle 10B and the overhead transport vehicle 10C via the rack 32. Hereinafter, operations of the overhead transport vehicle 10B and the overhead transport vehicle 10C will be described.

First, here is described an operation when the overhead transport vehicle 10B transports the article M to the rack 32a. As shown in FIGS. 12(A) and 12(B), the traveler 11 of the overhead transport vehicle 10B stops on a lateral side of the rack 32a on the straight track R7. Then, the lateral extender 18 advances the article M toward the rack 32a side to be placed at the exiting position P3 (see FIG. 4). At this time, the lateral extender 18 sets the amount of advancement so that an outermost trajectory S1 at the time of rotating the article M will not overlap with the overhead transport vehicle 10C traveling on the straight track R8. In this state, the article M has not reached directly above the rack 32a. As a result, it is possible to prevent interference between the overhead transport vehicle 10C traveling on the straight track R8 and the article M being transported by the overhead transport vehicle 10B.

Then, as shown in FIGS. 13(A) and 13(B), the rotator 19 rotates the holder 15 about the rotation axis AX to align the orientation of the article M with the orientation prescribed at the rack 32a. For example, the rotator 19 adjusts the orientation of the article M so that the lid Ma of the article M faces forward in the traveling direction of the overhead transport vehicle 10B (in the +X direction). The holder 15 is rotated while the article M is placed at the exiting position P3 where the article M does not interfere with the cover members 23, and it is therefore possible to rotate the article M by the predetermined angle θ or more. The orientation of the article M placed on each rack 32 is uniformly set so that the lid Ma is oriented in the +X direction. However, the orientation of the article M may be uniformly set to another direction, and the orientation of the lid Ma may be arbitrarily set at each rack 32.

As shown in FIG. 13(A), the clearance between the rack 32a and the rack 32b is set so that the outermost trajectory S1 when rotating the article M to be placed on the rack 32a does not overlap with an outermost trajectory S2 when rotating the article M to be placed on the rack 32b adjacent to the rack 32a by the overhead transport vehicle 10C traveling on the straight track R8. With this configuration, even if the overhead transport vehicle 10B and the overhead transport vehicle 10C receive or deliver the articles M from or to the adjacent racks 32a, 32b at the same time, interference between the articles M can be avoided, and the efficiency of transporting the articles M can be improved by receiving or delivering the articles M from or to the racks 32a, 32b at the same time.

After having aligned the orientation of the article M with the orientation prescribed at the rack 32a, as shown in FIG. 14(A), the lateral extender 18 of the overhead transport vehicle 10B advances the lift driver 17 (the holder 15) until the article M has been positioned directly above the rack 32a. In such an example, since the orientation of the article M is aligned with the orientation prescribed at the rack 32a, it is possible to prevent the article M from interfering with the overhead transport vehicle 10C traveling on the straight track R8. Next, the lift driver 17 lowers the holder 15 and places the article M on the rack 32a, and the article M is then released from being held by the holder 15. After having placed the article M on the rack 32a, as shown in FIG. 14(B), the lift driver 17 raises the holder 15. Then, the lateral extender 18 retracts the lift driver 17 (the holder 15) into the main body 12. Through a series of these operations, the overhead transport vehicle 10B completes the transportation of the article M to the rack 32a.

We next describe an example where the overhead transport vehicle 10B receives the article M placed on the rack 32a. As with the above description, the overhead transport vehicle 10B causes the traveler 11 to stop on the lateral side of the rack 32a, and after having advanced the lateral extender 18, lowers the holder 15 to hold the article M. Then, the lift driver 17 raises the holder 15 to lift the article M. Next, the lateral extender 18 retracts the holder 15 slightly (moves the holder 15 slightly in the −Y direction)

and places the article M at the exiting position P3 as shown in FIG. 13(A). Then, the rotator 19 rotates the holder 15 to align the orientation of the article M with the arrangement of the cover members 23 of the main body 12. Then, the lateral extender 18 retracts the lift driver 17 (the holder 15) and places the article M at the storing position P1 (see FIG. 4). Through a series of these operations, the overhead transport vehicle 10B completes the receiving of the article M placed on the rack 32a.

Next, we describe operations when the overhead transport vehicle 10C traveling on the straight track R8 receives the article M placed on the rack 32a. As shown in FIGS. 15(A) and 15(B), the traveler 11 of the overhead transport vehicle 10C stops on the lateral side of the rack 32a. Next, the lateral extender 18 advances the holder 15 until the holder 15 has been positioned directly above the article M, and thereafter the holder 15 is lowered by the lift driver 17 to hold the article M.

After the holder 15 has held the article M, the lift driver 17 raises the holder 15 to raise the article M. Since the raised article M is rising while the orientation thereof is aligned with the rack 32b, it does not interfere with the overhead transport vehicle 10B traveling on the straight track R7. Next, the lateral extender 18 retracts the lift driver 17 (the holder 15) slightly to the overhead transport vehicle 10C side (moves the lift driver 17 slightly in the +Y direction) and places the article M at the exiting position P3. At the exiting position P3, an outermost trajectory S3 at the time of rotating the article M will not overlap with the overhead transport vehicle 10B traveling on the straight track R7. With this configuration, even when the article M is rotated, interference between the overhead transport vehicle 10B and the article M can be prevented.

Next, as shown in FIGS. 16(A) and 16(B), the rotator 19 rotates the holder 15 about the rotation axis AX to align the orientation of the article M with the cover members 23. At this time, the rotator 19 adjusts the orientation of the article M so that the lid Ma of the article M faces the left side of the traveling direction of the overhead transport vehicle 10C, that is, the rack 32a side. After having adjusted the orientation of the article M, as shown in FIG. 17(A) and FIG. 17(B), the lateral extender 18 retracts the lift driver 17 (the holder 15) and places the article M at the storing position P1 (see FIG. 4). Through a series of these operations, the overhead transport vehicle 10C completes the receiving of the article M placed on the rack 32a.

As described above, in this example, both of the overhead transport vehicles 10B, 10C traveling on the straight tracks R7, R8 can receive or deliver the article M from or to the rack 32a, and the article M can be received or delivered between the overhead transport vehicles 10B, 10C via the racks 32. When either one of the overhead transport vehicles 10B, 10C receives or delivers the article M from or to the rack 32, it does not hinder the traveling of the other one of the overhead transport vehicles 10B, 10C, and it is therefore possible to improve the efficiency of transportation of the articles M. If the article M is rotated at the exiting position P2 below the main body 12 of the overhead transport vehicles 10B, 10C (see FIG. 4), the article M cannot be efficiently received or delivered from or to the rack 32. Therefore, as described above, the article M can be efficiently received or delivered from or to the rack 32 by placing the article M at the exiting position P3 in the lateral direction (see FIG. 4) and then rotating it.

Selected examples have been described above. However, this disclosure is not limited to the above description, and various modifications may be made without departing from the scope of this disclosure. For example, in the configuration shown in FIGS. 11 to 17, the description takes the example in which the overhead transport vehicles 10B, 10C traveling on the straight tracks R7, R8 travel in opposite directions. However, the disclosure is not limited to this configuration. For example, the overhead transport vehicles 10B, 10C traveling on the straight tracks R7, R8 may both travel in the same direction. Furthermore, the contents of Japanese Patent Application No. 2017-157189 and all publications cited herein are incorporated herein by reference.

The invention claimed is:

1. A transport system including
a track provided on a ceiling or in a vicinity of the ceiling, and an overhead transport vehicle comprising:
a traveler that travels on a track provided on a ceiling or in a vicinity of the ceiling;
a main body mounted on the traveler;
a transferer including a holder to hold an article, a mover to move the holder between a storing position at which the article held by the holder is stored within the main body and an exiting position at which the article exits the main body, and a rotator to rotate the holder about a vertical rotation axis, the transferer receiving or delivering the article from or to a transfer destination where the article is to be placed in a prescribed orientation; and
a controller to control operations of the traveler and the transferer, wherein
the main body has an inner wall at a position at which the article held by the holder comes in contact therewith when the holder set at the storing position is rotated by a predetermined angle by the rotator,
the controller causes the traveler to travel in a state where the holder is set at the storing position by the mover, and when the article is received from or delivered to the transfer destination by means of the transferer, causes the rotator to rotate the holder by the predetermined angle or more in a state where the holder is positioned at the exiting position by the mover to align the article held by the holder with the prescribed orientation of the transfer destination, and the mover includes a lift driver that causes the holder to ascend or descend between the storing position and the exiting position at which the article held by the holder exits downward from the main body, wherein
the overhead transport vehicle includes a lateral extender that advances or retracts the holder laterally with respect to the track;
the track has a straight section and a curved section connected to the straight section;
the transfer destination is provided on a lower and lateral side of the curved section; and
when the article is received from or delivered to the transfer destination by the transferer, the controller performs control to
cause the traveler to stop in the curved section of the track,
cause the lift driver to lower the holder to the exiting position,
cause the rotator to rotate the holder to align the article held by the holder with the prescribed orientation of the transfer destination,
cause the lateral extender to advance the lift driver to a position at which the holder or the article is directly above the transfer destination, and
cause the lift driver to lower the holder.

2. The transport system according to claim 1, wherein:
the straight section is provided along a side wall of a building;
the curved section is provided to curve from the direction of the straight section and be away from the side wall;
the transfer destination is provided on a lower and lateral side of the curved section and in the vicinity of the side wall; and
the side wall is provided at a position at which the article held by the holder comes in contact therewith when the lift driver is advanced to a position at which the article is directly above the transfer destination by the lateral extender without the rotator rotating the holder after the overhead transport vehicle stops the traveler in the curved section.

* * * * *